US010298226B2

(12) United States Patent
Imanishi et al.

(10) Patent No.: US 10,298,226 B2
(45) Date of Patent: May 21, 2019

(54) SIGNAL TRANSMISSION DEVICE AND POWER SWITCHING ELEMENT DRIVING DEVICE

(71) Applicant: Mitsubishi Electric Corporation, Tokyo (JP)

(72) Inventors: Motoki Imanishi, Fukuoka (JP); Kenichi Morokuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 33 days.

(21) Appl. No.: 15/448,184

(22) Filed: Mar. 2, 2017

(65) Prior Publication Data
US 2018/0013419 A1 Jan. 11, 2018

(30) Foreign Application Priority Data

Jul. 11, 2016 (JP) .................................. 2016-136683

(51) Int. Cl.
H03B 1/00 (2006.01)
H03K 3/00 (2006.01)
H03K 17/567 (2006.01)
H01L 29/16 (2006.01)
H03K 17/691 (2006.01)
H03K 5/1252 (2006.01)
H03K 19/0175 (2006.01)

(52) U.S. Cl.
CPC ....... H03K 17/567 (2013.01); H01L 29/1608 (2013.01); H03K 5/1252 (2013.01); H03K 17/691 (2013.01); H03K 19/0175 (2013.01)

(58) Field of Classification Search
CPC .......................... H03K 17/567; H01L 29/1608
USPC ......................................................... 327/109
See application file for complete search history.

(56) References Cited

U.S. PATENT DOCUMENTS 7,923,710 B2 * 4/2011 Crawley ............... H03F 1/3211
250/551
2016/0056850 A1 2/2016 Nagase et al.
2017/0117877 A1 * 4/2017 Ha ......................... H04L 25/12

FOREIGN PATENT DOCUMENTS

JP 2013-058878 A 3/2013
JP 2016-046723 A 4/2016

* cited by examiner

Primary Examiner — Metasebia T Retebo
(74) Attorney, Agent, or Firm — Studebaker & Brackett PC

(57) ABSTRACT

A signal transmission device relating to a technique disclosed in the specification of the present application includes: an isolation transformer; an input-side circuit connected to an input side of the isolation transformer; and an output-side circuit connected to an output side of the isolation transformer. The output-side circuit includes a first differential circuit having a first input and a second input connected to the first terminal and the second terminal respectively. A reference potential of the first differential circuit is connected to the second terminal.

20 Claims, 15 Drawing Sheets

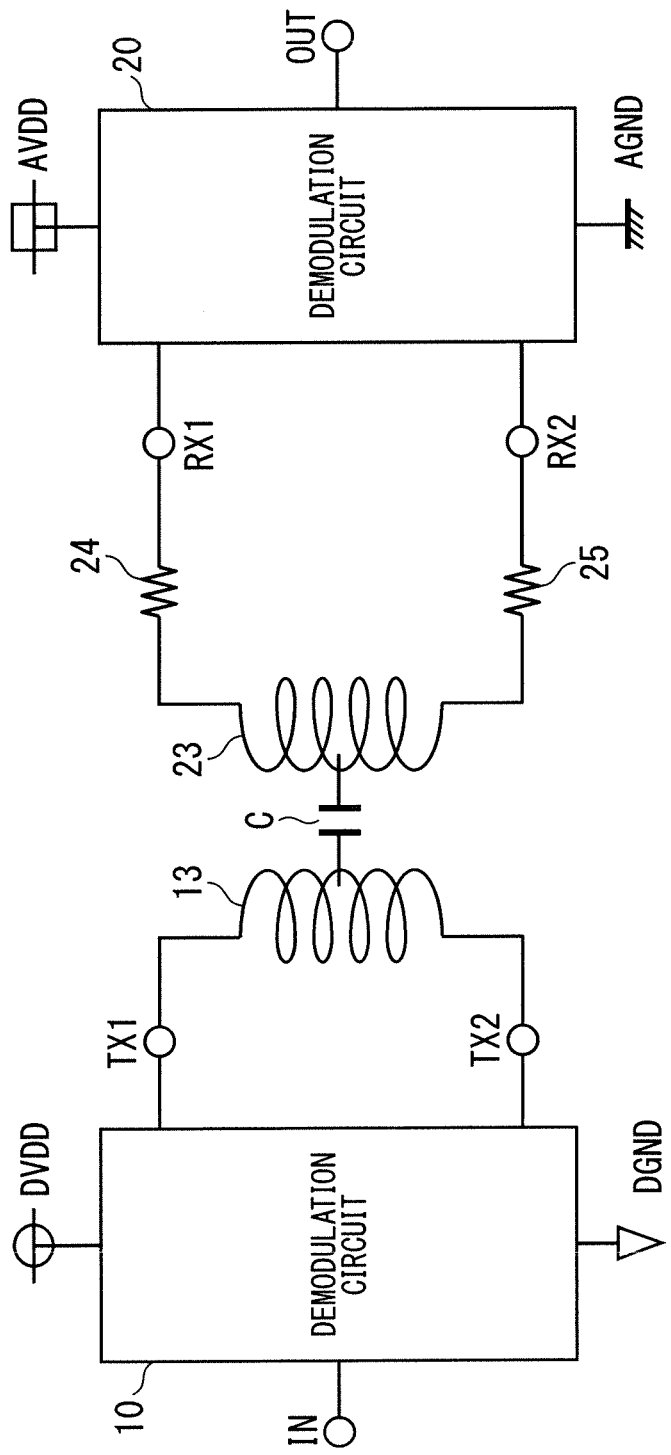
F I G. 1

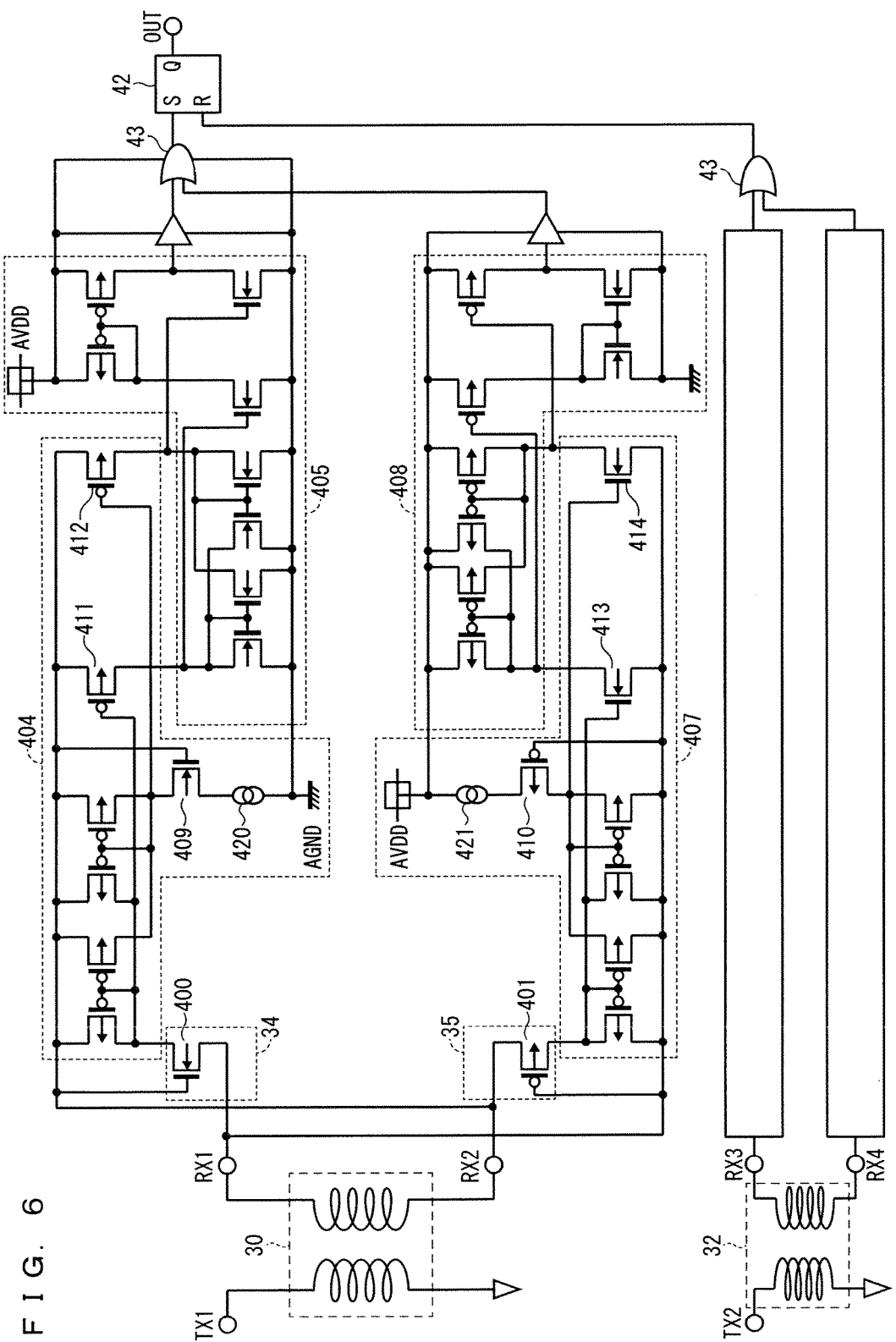
F I G. 6

F I G. 1 2
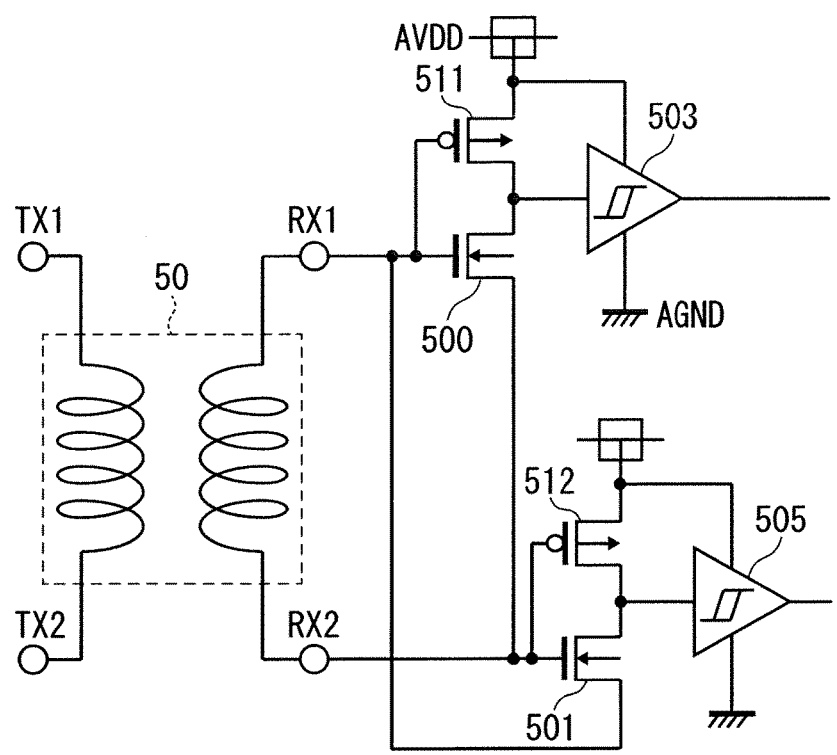

F I G. 1 4
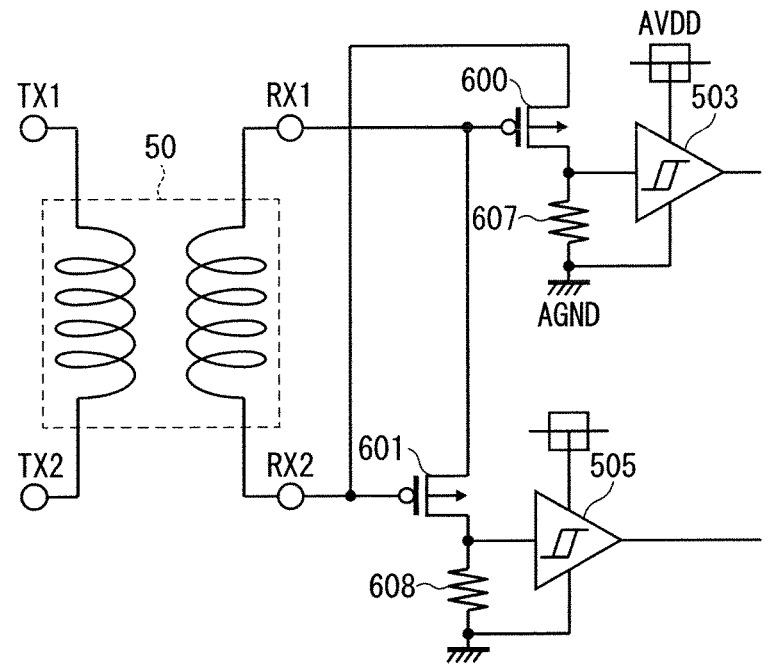
F I G. 1 5
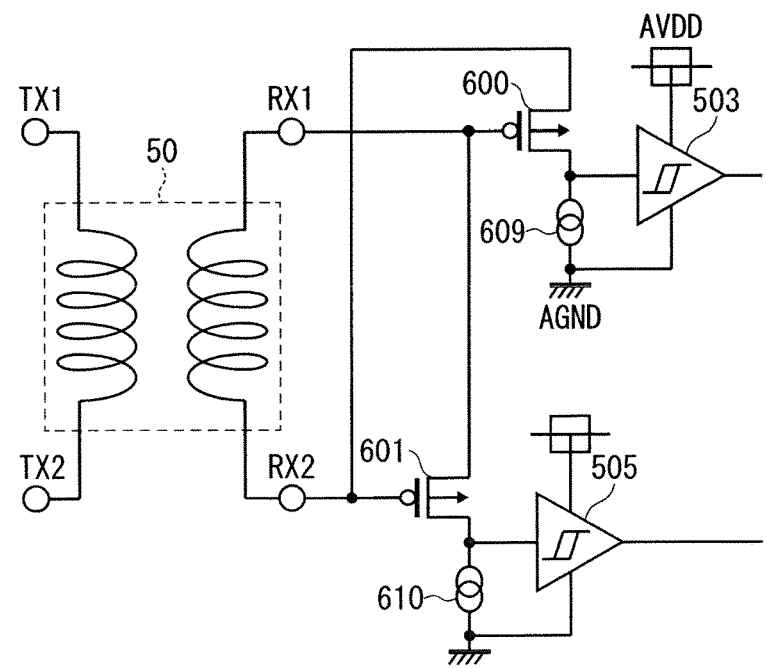

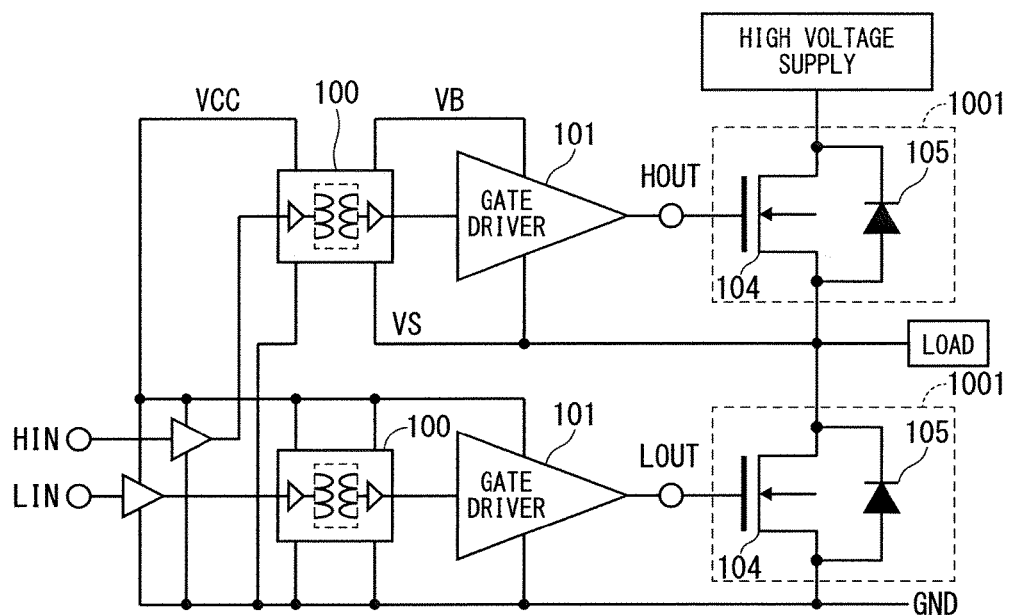
F I G. 1 8

SIGNAL TRANSMISSION DEVICE AND POWER SWITCHING ELEMENT DRIVING DEVICE

FIELD OF THE INVENTION

A technique disclosed in the specification of the present application relates to a digital isolator used in the field of communication or in a semiconductor switching element driving device requiring communication between different power supplies, for example.

BACKGROUND ART

For a use involving communication between a circuit configuration on a primary side (input side) and a circuit configuration on a secondary side (output side) of different power supplies, dV/dt noise has conventionally be caused in some cases resulting from dV/dt to vary a reference potential difference between an input side and an output side of an isolation transformer. In response to the dV/dt noise, effort has been made to prevent malfunction due to such noise.

For example, in a circuit illustrated in Japanese Patent Application Laid-Open No. 2016-46723, a differential voltage responsive to a current flowing on an input side of an isolation transformer is induced in a coil on an output side of the isolation transformer. A potential is received by differential input from the output-side coil to remove the dV/dt noise resulting from dV/dt. In this way, malfunction due to the dV/dt noise is prevented.

According to the aforementioned technique, however, if the dV/dt noise is caused to place a signal at the output-side coil at a voltage going out of an operable range of the output-side circuit configuration, this signal cannot be received by the output-side circuit configuration. Hence, the dV/dt noise cannot be removed even in the circuit to receive a potential by differential input.

SUMMARY OF THE INVENTION

The present invention relates to a technique of achieving transmission of a signal, even if dV/dt noise is caused to place the signal at a voltage going out of an operable range of a circuit.

A first aspect of a technique disclosed in the specification of the present application includes: an isolation transformer; an input-side circuit connected to an input side of the isolation transformer; and an output-side circuit connected to an output side of the isolation transformer. The output-side circuit is connected to a first terminal and a second terminal. The first terminal is on the output side of the isolation transformer. The second terminal is on the output side of the isolation transformer and on an opposite side to the first terminal. The output-side circuit includes a first differential circuit having a first input and a second input connected to the first terminal and the second terminal respectively. The first differential circuit outputs a signal responsive to a potential difference between the first input and the second input. A reference potential of the first differential circuit is connected to the second terminal.

A second aspect of the technique disclosed in the specification of the present application includes: the aforementioned signal transmission device; a gate driver connected to the signal transmission device; and a power switching element connected to an output terminal of the gate driver.

According to the first aspect of the technique disclosed in the specification of the present application, even if dV/dt noise is caused to place a signal at a voltage going out of an operable range of a circuit, this signal can still be transmitted According to the second aspect of the technique disclosed in the specification of the present application, even if the dV/dt noise is caused while the power switching element operates, a signal can still be transmitted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 schematically illustrates the configuration of a signal transmission device according to a preferred embodiment;

FIG. 6 illustrates the internal configuration of a circuit in detail in a subsequent stage of the receiving core in the signal transmission device according to the preferred embodiment;

FIGS. 10, 11, and 12 each schematically illustrate a part of the configuration of the signal transmission device according to the preferred embodiment;

FIGS. 14, 15, and 16 each schematically illustrate a part of the configuration of the signal transmission device according to the preferred embodiment; and FIGS. 17 and 18 each illustrate a circuit configuration to which the signal transmission device according to the preferred embodiment is applied.

EMBODIMENT FOR CARRYING OUT THE INVENTION

Figure 2:
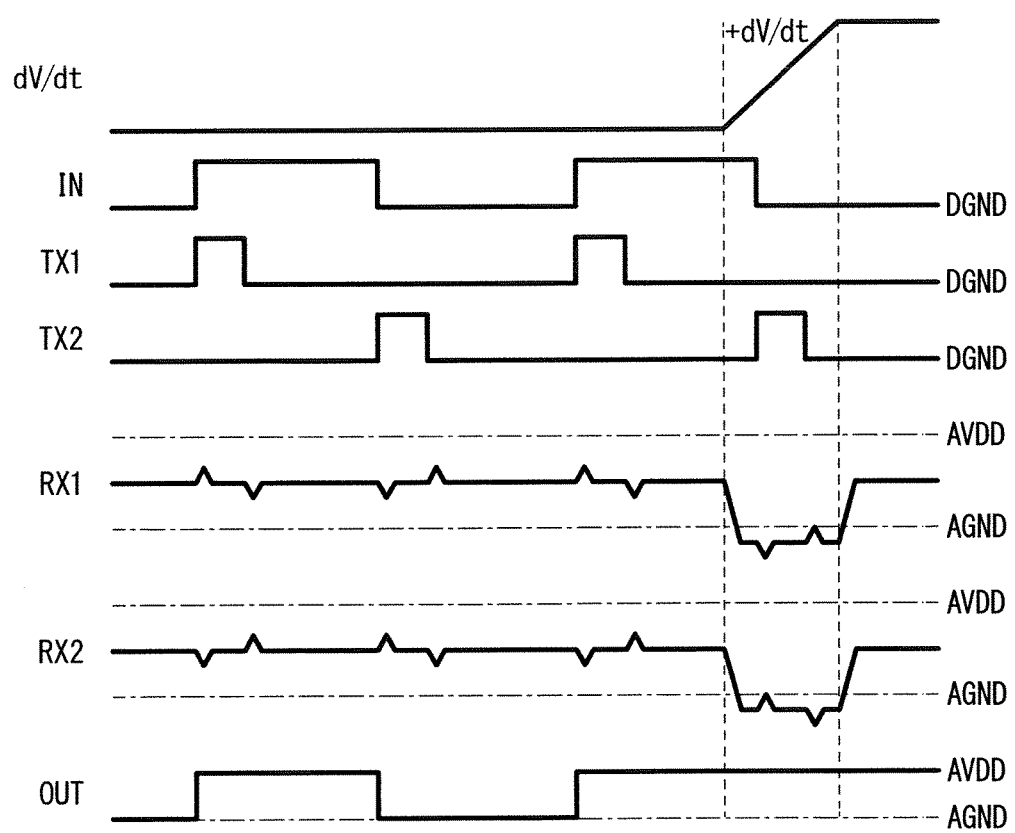
FIG. 2 is a sequence chart illustrating variations in potentials at isolation transformer terminals during +dV/dt.

Preferred embodiments of the present invention will be described below by referring to the accompanying drawings.

The drawings are depicted schematically. For the convenience of illustration, structures are omitted from the drawings or structures in the drawings are simplified, where appropriate. The sizes of images, etc. shown in different drawings and the positions of such images relative to each other in the different drawings are not entirely correct but can be changed, where appropriate.

Comparable components referred to in the following description are identified by the same signs in the drawings. These components will be described as having the same name and the same function. Thus, in some cases, these components will not be described in detail to avoid overlaps.

Ordinal numbers such as a "first" and a "second" given in the following description are for the sake of convenience for facilitating understanding of the preferred embodiments. The present invention is not to be limited to order, etc. that might result from such ordinal numbers.

First Preferred Embodiment

A signal transmission device according to a first preferred embodiment will be described below.

<Configuration of Signal Transmission Device>

FIG. 1 schematically illustrates the configuration of the signal transmission device according to the first preferred embodiment.

As illustrated in FIG. 1, the signal transmission device includes an input-side circuit configuration, an output-side circuit configuration, and an isolation transformer between the input-side circuit configuration and the output-side circuit configuration.

The isolation transformer is a structure including an oxide film or an insulating film such as a polyimide film formed between the input-side circuit configuration with respect to the transformer and the output-side circuit configuration with respect to the transformer. With this configuration, electrical isolation can be ensured between the input-side circuit configuration and the output-side circuit configuration. The following description of the preferred embodiments proceeds on the assumption that the isolation transformer is particularly a transformer without a core such as a micro-transformer. However, the isolation transformer may have a core such as an iron core.

The input-side circuit configuration includes a demodulation circuit 10 and a coil wiring 13.

The output-side circuit configuration includes a demodulation circuit 20, a coil wiring 23, an impedance 24, and an impedance 25.

The isolation transformer provided between the input-side circuit configuration and the output-side circuit configuration, specifically, the isolation transformer including the coil wiring 13 and the coil wiring 23 has a parasitic (stray) capacitance C. An impedance component such as a coil wiring also exists between the input-side circuit configuration and the output-side circuit configuration.

For a use involving communication between the input-side circuit configuration and the output-side circuit configuration of different power supplies, variations are caused in a reference potential difference between the input-side circuit configuration and the output-side circuit configuration across the isolation transformer. In this case, capacitive coupling occurs in the parasitic capacitance C to charge the parasitic capacitance C with a current or the current is discharged from the parasitic capacitance C.

Charging the parasitic capacitance C with a current or discharging the current from the parasitic capacitance C, and the existence of the impedance component such as a coil wiring vary a potential at an output-side isolation transformer terminal. Specifically, dV/dt noise is caused.

At this time, if a potential at the output-side isolation transformer terminal varies to generate a voltage signal going out of an operable range of the output-side circuit configuration, this signal cannot be received properly by the output-side circuit configuration.

FIG. 2 is a sequence chart illustrating variations in potentials at isolation transformer terminals in an instance where a reference potential in the output-side circuit configuration varies positively, specifically, during +dV/dt.

FIG. 2 illustrates the following in the order named: dV/dt; a potential (IN) of an input signal shown in FIG. 1; a potential (TX1) of an output signal from the demodulation circuit 10 shown in FIG. 1; a potential (TX2) of an output signal from the demodulation circuit 10 shown in FIG. 1; a potential (RX1) of a received signal at the demodulation circuit 20 shown in FIG. 1; a potential (RX2) of a received signal at the demodulation circuit 20 shown in FIG. 1; and a potential (OUT) of an output signal from the demodulation circuit 20 shown in FIG. 1.

As illustrated in FIG. 2, in a period +dV/dt, due to the occurrence of the dV/dt noise, potential drop, more specifically, potential drop to a value near a GND potential of the demodulation circuit 20 is observed at each of RX1 and RX2.

In the period +dV/dt, a potential at each of RX1 and RX2 takes a value smaller than the GND potential of the demodulation circuit 20. This makes a signal go out of an operable range of the demodulation circuit 20, so that this signal cannot be received properly in the period +dV/dt.

As a result, the potential at each of RX1 and RX2 is not reflected in OUT in the period +dV/dt.

Figure 3:
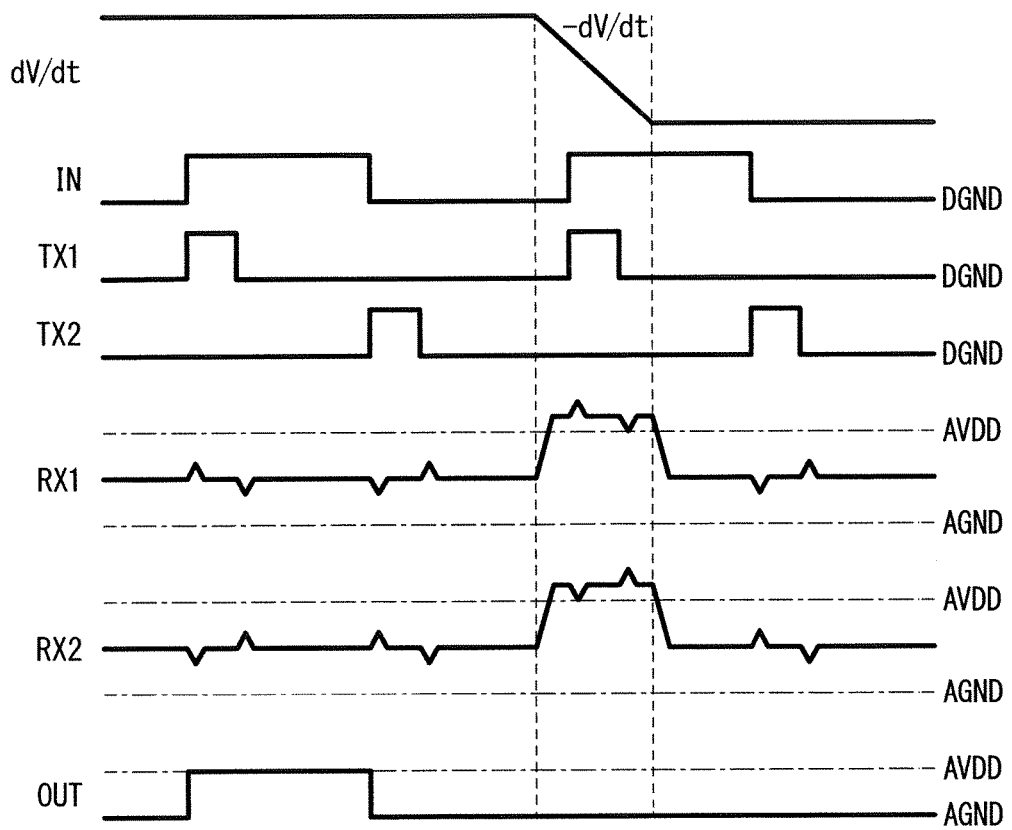
FIG. 3 is a sequence chart illustrating variations in potentials at the isolation transformer terminals during −dV/dt.

FIG. 3 is a sequence chart illustrating variations in potentials at the isolation transformer terminals in an instance where a reference potential in the output-side circuit configuration varies negatively, specifically, during −dV/dt.

FIG. 3 illustrates the following in the order named: dV/dt; a potential (IN) of an input signal shown in FIG. 1; a potential (TX1) of an output signal from the demodulation circuit 10 shown in FIG. 1; a potential (TX2) of an output signal from the demodulation circuit 10 shown in FIG. 1; a potential (RX1) of a received signal at the demodulation circuit 20 shown in FIG. 1; a potential (RX2) of a received signal at the demodulation circuit 20 shown in FIG. 1; and a potential (OUT) of an output signal from the demodulation circuit 20 shown in FIG. 1.

As illustrated in FIG. 3, in a period −dV/dt, due to the occurrence of the dV/dt noise, potential increase, more specifically, potential increase to a value near a power supply potential of the demodulation circuit 20 is observed at each of RX1 and RX2.

In the period −dV/dt, a potential at each of RX1 and RX2 takes a value larger than the power supply potential of the demodulation circuit 20. This makes a signal go out of an operable range of the demodulation circuit 20, so that this signal cannot be received properly in the period −dV/dt.

As a result, the potential at each of RX1 and RX2 is not reflected in OUT in the period −dV/dt.

As described above, if the dV/dt noise is caused to make a signal go out of an operable range of the output-side circuit configuration, this signal cannot be transmitted.

Assuming that the value of a current required for charging and discharging the parasitic capacitance C in response to the occurrence of the dV/dt noise is I, the following formula is established:

$$I = C \times dV/dt \quad \text{formula 1}$$

A variation value $\Delta V$ of a potential at the output-side isolation transformer terminal is expressed by the following formula:

$$\Delta V = R \times I = C \times dV/dt \times R \quad \text{formula 2}$$

Assuming that C is 0.300 pF, dV/dt is 100 kV/us, and R is 100Ω, the following formula is established:

$$\Delta V = 3 \ [V] \quad \text{formula 3}$$

Figure 4:
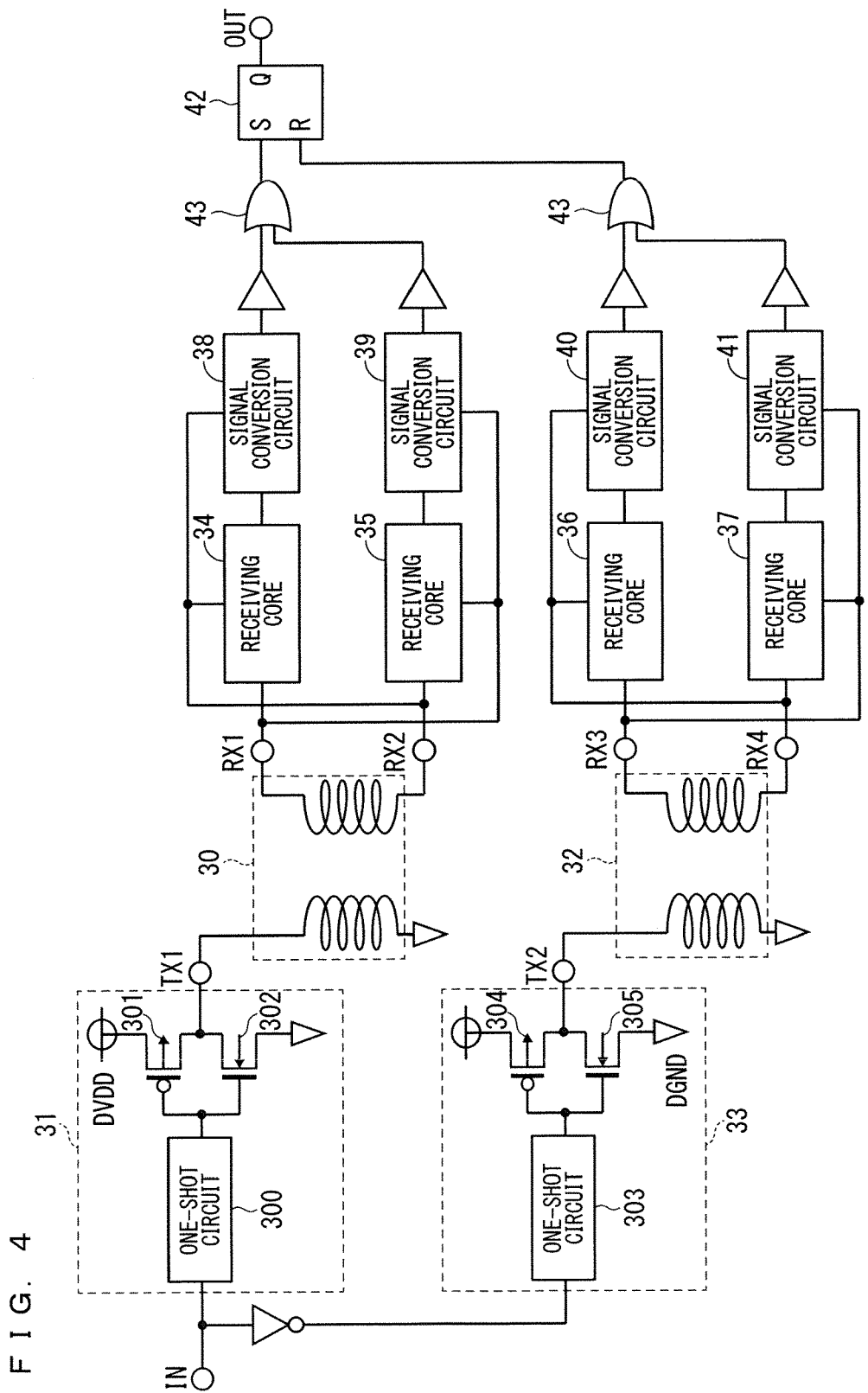
FIG. 4 schematically illustrates the configuration of the signal transmission device according to the preferred embodiment.

FIG. 4 schematically illustrates the configuration of the signal transmission device according to the first preferred embodiment. The signal transmission device illustrated in FIG. 4 has a single-ended circuit configuration using two isolation transformers.

The signal transmission device illustrated in FIG. 4 includes a modulation circuit 31 that operates on the ON edge, specifically, rising edge of a signal. The modulation circuit 31 functions as an input-side modulation circuit that drives an isolation transformer 30. The signal transmission device illustrated in FIG. 4 includes a modulation circuit 33 that operates on the OFF edge, specifically, falling edge of a signal. The modulation circuit 33 functions as an input-side modulation circuit that drives an isolation transformer 32.

The modulation circuit 31 includes a one-shot circuit 300 that detects an ON edge, and a metal-oxide-semiconductor field-effect transistor (MOSFET) 301 and a MOSFET 302 connected in parallel to each other.

The modulation circuit 33 includes a one-shot circuit 303 that detects an OFF edge, and a MOSFET 304 and a MOSFET 305 connected in parallel to each other.

The signal transmission device illustrated in FIG. 4 includes two receiving cores forming an output-side circuit and being provided in correspondence with each isolation transformer.

More specifically, the signal transmission device illustrated in FIG. 4 include a receiving core 34 having an input terminal connected to RX1 as an output-side isolation transformer terminal of the isolation transformer 30, and a receiving core 35 having an input terminal connected to RX2 as an output-side isolation transformer terminal of the isolation transformer 30 and on an opposite side to RX1.

The signal transmission device illustrated in FIG. 4 further include a receiving core 36 having an input terminal connected to RX3 as an output-side isolation transformer terminal of the isolation transformer 32, and a receiving core 37 having an input terminal connected to RX4 as an output-side isolation transformer terminal of the isolation transformer 32 and on an opposite side to RX3.

A reference potential of one receiving core is fixed to a potential at a terminal on an opposite side to a terminal to which the input terminal of this receiving core is connected. Specifically, a reference potential of a receiving core having an input terminal connected to RX1 is fixed to a potential at RX2. A reference potential of a receiving core having an input terminal connected to RX3 is fixed to a potential at RX4.

The signal transmission device illustrated in FIG. 4 includes a signal conversion circuit 38 provided in a subsequent stage of the receiving core 34 and functioning to convert a received signal to a signal based on a GND (AGND) potential. The signal transmission device illustrated in FIG. 4 includes a signal conversion circuit 40 provided in a subsequent stage of the receiving core 36 and functioning to convert a received signal to a signal based on a GND (AGND) potential.

The signal transmission device illustrated in FIG. 4 includes a signal conversion circuit 39 provided in a subsequent stage of the receiving core 35 and functioning to convert a received signal to a signal based on a power supply (AVDD) potential. The signal transmission device illustrated in FIG. 4 includes a signal conversion circuit 41 provided in a subsequent stage of the receiving core 37 and functioning to convert a received signal to a signal based on a power supply (AVDD) potential.

Outputs from the signal conversion circuits in a pair corresponding to one isolation transformer are synthesized by OR logic at a synthesis circuit 43. Outputs from the synthesis circuits 43, corresponding to demodulated signals obtained from the corresponding isolation transformers, are demodulated to produce a signal at an SR-flip-flop latch circuit 42. As a result, an output signal (OUT) is generated.

<Configuration of Receiving Core>

Figure 5:
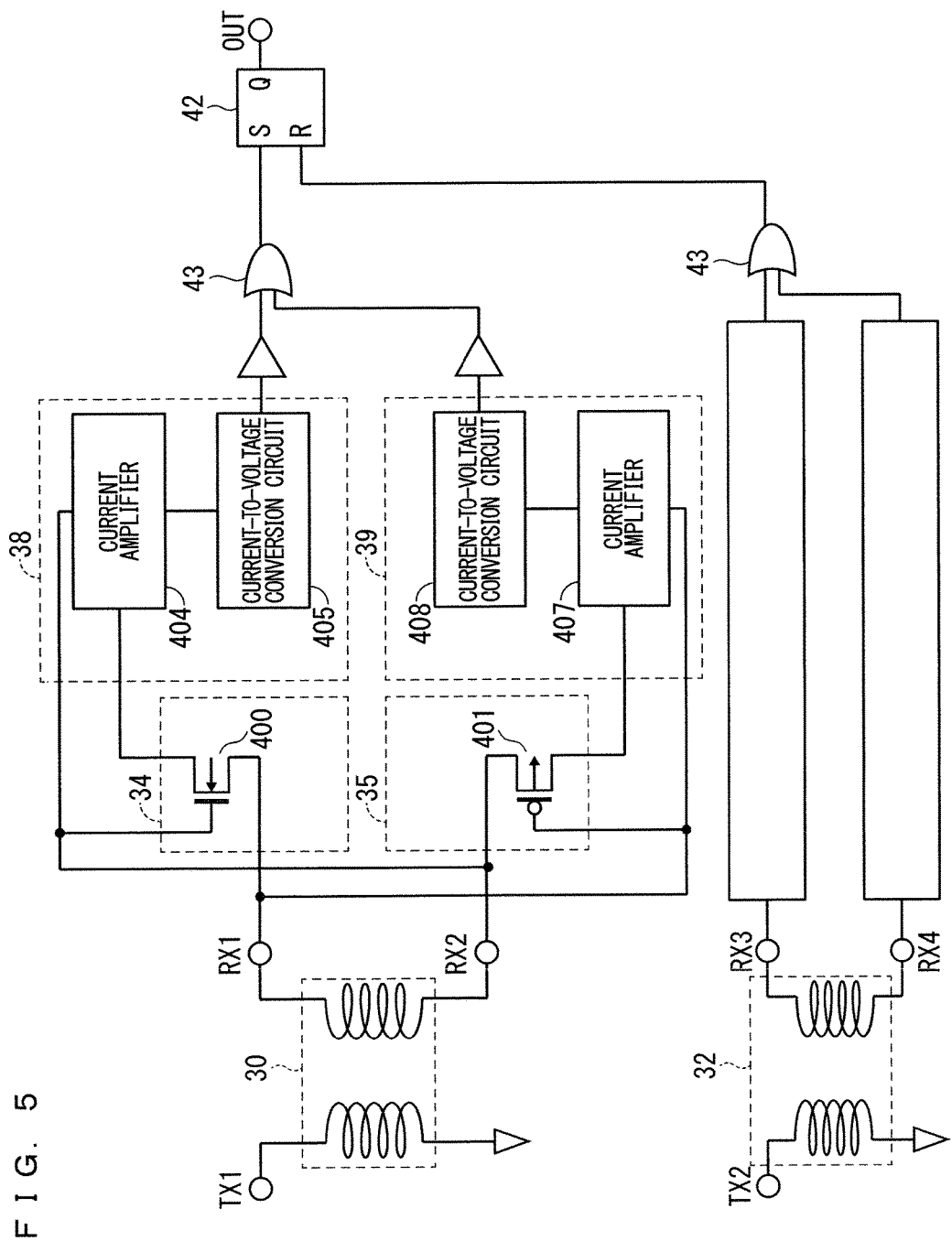
FIG. 5 illustrates the internal configuration of a receiving core in detail in the signal transmission device according to the preferred embodiment.

FIG. 5 illustrates the internal configuration of the receiving core in detail in the signal transmission device according to the first preferred embodiment. FIG. 5 illustrates a circuit configuration connected to the isolation transformer 30. A circuit configuration connected to the isolation transformer 32 is the same as the circuit configuration connected to the isolation transformer 30, so that it is not illustrated in FIG. 5.

The receiving core 34 includes an N-type MOSFET 400. The MOSFET 400 has a gate potential connected to RX2 on an opposite side.

The receiving core 35 includes a P-type MOSFET 401. The MOSFET 401 has a gate potential connected to RX1 on an opposite side.

A current responsive to a potential difference between RX1 and RX2 flows in the MOSFET 400. Meanwhile, the gate potential of the MOSFET 400 is connected to RX2 on an opposite side to RX1 to which the source potential of the MOSFET 400 is connected. Thus, a potential difference between the source and the gate of the MOSFET 400 is equal to a potential difference between RX1 and RX2.

As a result, even if the dV/dt noise is caused to make a potential at each of RX1 and RX2 vary largely, a current output from the MOSFET 400 is still responsive to a potential difference between RX1 and RX2. Specifically, even if the dV/dt noise is caused to make a potential at each of RX1 and RX2 vary largely, the MOSFET 400 still functions as a differential circuit that outputs a signal responsive to a potential difference between a source potential and a gate potential.

A current signal from the MOSFET 400 is output to a current amplifier 404 and is amplified as a current signal by the current amplifier 404. Next, to be extracted as a signal based on a GND (AGND) potential, the amplified current signal is passed through a current-to-voltage conversion circuit 405 and is then output as a voltage signal.

A current responsive to a potential difference between RX1 and RX2 further flows in the MOSFET 401. Meanwhile, the gate potential of the MOSFET 401 is connected to RX1 on an opposite side to RX2 to which the source potential of the MOSFET 401 is connected. Thus, a potential difference between the source and the gate of the MOSFET 401 is equal to a potential difference between RX1 and RX2.

As a result, even if the dV/dt noise is caused to make a potential at each of RX1 and RX2 vary largely, a current output from the MOSFET 401 is also still responsive to a potential difference between RX1 and RX2. Specifically, even if the dV/dt noise is caused to make a potential at each of RX1 and RX2 vary largely, the MOSFET 401 also still functions as a differential circuit that outputs a signal responsive to a potential difference between a source potential and a gate potential.

A current signal from the MOSFET 401 is output to a current amplifier 407 and is amplified as a current signal by the current amplifier 407. Next, to be extracted as a signal based on a power supply (AVDD) potential, the amplified current signal is passed through a current-to-voltage conversion circuit 408 and is then output as a voltage signal.

<Detailed Configuration of Subsequent Stage of Receiving Core>

FIG. 6 illustrates the internal configuration of a circuit in detail in a subsequent stage of the receiving core in the signal transmission device according to the first preferred embodiment. FIG. 6 illustrates a circuit configuration connected to the isolation transformer 30. A circuit configuration connected to the isolation transformer 32 is the same as the circuit configuration connected to the isolation transformer 30, so that it is not illustrated in FIG. 6.

The current amplifier 404 connected to the receiving core 34 includes a current mirror circuit that amplifies a current signal output from the MOSFET 400 in a predetermined instance.

The current amplifier 404 includes a MOSFET 409 that flows a constant current 420 based on a GND potential, and a MOSFET 411 and a MOSFET 412 for transmitting a current signal output from the MOSFET 400 to the current-to-voltage conversion circuit 405 in a subsequent stage.

Likewise, the current amplifier 407 connected to the receiving core 35 is a circuit that amplifies a current signal output from the MOSFET 401 in a predetermined instance.

The current amplifier 407 includes a MOSFET 410 that flows a constant current 421 based on a power supply potential, and a MOSFET 413 and a MOSFET 414 for transmitting a current signal output from the MOSFET 401 to the current-to-voltage conversion circuit 408 in a subsequent stage.

First, a current flowing in the MOSFET 401 in the receiving core 35 is compared with the constant current 421 flowing in the MOSFET 410.

If a potential difference is not generated between RX1 and RX2 so no current flows in the MOSFET 401, only the constant current 421 flows in the MOSFET 410. The MOSFET 410 generates a gate potential responsive to the constant current 421.

Thus, a gate potential responsive to the constant current 421 flowing in the MOSFET 410, which is about 1.5 V, for example, is applied to the MOSFET 413. Then, the MOSFET 413 flows a current responsive to this gate potential.

A potential only of a value about 0.3 V, for example, is applied to the MOSFET 414, so that the gate of the MOSFET 414 is OFF.

Meanwhile, if a potential difference is generated between RX1 and RX2 so a current flows in the MOSFET 401, the constant current 421 also flows in the MOSFET 410. The value of the current flowing in the MOSFET 401 is determined by the size of the MOSFET 401 and the value of a current excited by the isolation transformer.

In this case, a gate potential applied to the MOSFET 413 changes to about 1.2 V, for example, so as to follow potential change at RX2.

A gate potential responsive to the value of the current flowing in the MOSFET 401 is applied to the MOSFET 414. Thus, a gate potential about 1.5 V, for example, is applied to the MOSFET 414 and this gate potential is larger than the gate potential applied to the MOSFET 413.

As described above, in the presence of a current flowing in the MOSFET 401, logic is inverted in the current-to-voltage conversion circuit 408 in a subsequent stage by the MOSFETs 413 and 414.

A voltage signal is obtained as a result of demodulation by a folded current mirror provided in the current-to-voltage conversion circuit 408 and by the SR-flip-flop latch circuit 42 in a subsequent stage.

Likewise, in the presence of a current flowing in the MOSFET 400 in the receiving core 34, logic is inverted in the current-to-voltage conversion circuit 405 in a subsequent stage by the MOSFETs 411 and 412.

A voltage signal is obtained as a result of demodulation by a folded current mirror in the current-to-voltage conversion circuit 405 and by the SR-flip-flop latch circuit 42 in a subsequent stage.

Figure 7:
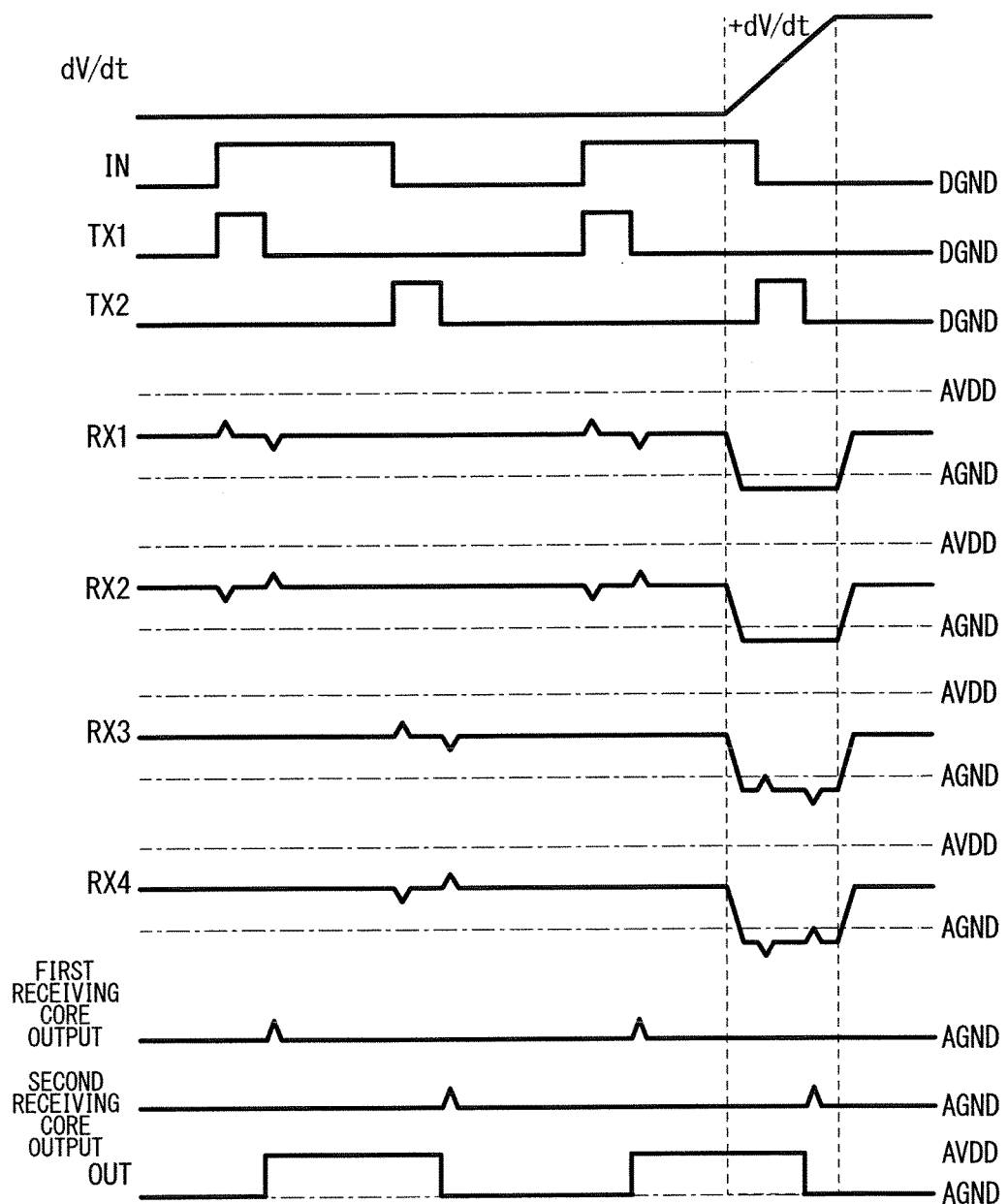
FIG. 7 is a sequence chart illustrating variations in potentials at isolation transformer terminals during +dV/dt.

FIG. 7 is a sequence chart illustrating variations in potentials at isolation transformer terminals in an instance where a reference potential in the output-side circuit configuration varies positively, specifically, during +dV/dt.

FIG. 7 illustrates the following in the order named: dV/dt; a potential (IN) of an input signal shown in FIG. 4; a potential (TX1) of an output signal from the demodulation circuit 31 shown in FIG. 4; a potential (TX2) of an output signal from the demodulation circuit 33 shown in FIG. 4; a potential (RX1) of a received signal at the receiving core 34 shown in FIG. 4; a potential (RX2) of a received signal at the receiving core 35 shown in FIG. 4; a potential (RX3) of a received signal at the receiving core 36 shown in FIG. 4; a potential (RX4) of a received signal at the receiving core 37 shown in FIG. 4; a potential of a output signal from each the receiving cores 34 and 36 (first receiving core output) shown in FIG. 4; a potential of an output signal from each of the receiving cores 35 and 37 (second receiving core output) shown in FIG. 4; and a potential (OUT) of an output signal from the SR-flip-flop latch circuit 42 shown in FIG. 4.

As illustrated in FIG. 7, in a period +dV/dt, due to the occurrence of the dV/dt noise, potential drop, more specifically, potential drop to a value near a GND potential of the output-side circuit configuration is observed at each of RX1, RX2, RX3, and RX4. In the period +dV/dt, a potential at each of RX3 and RX4 takes a value smaller than the GND potential.

Meanwhile, the gate potential of a MOSFET in the receiving core 36 is connected to RX4. Thus, even if the dV/dt noise is caused to make a potential at each of RX3 and RX4 vary largely, a current output from the MOSFET in the receiving core 36 is still responsive to a potential difference between RX3 and RX4.

Likewise, the gate potential of a MOSFET in the receiving core 37 is connected to RX3. Thus, even if the dV/dt noise is caused to make a potential at each of RX3 and RX4 vary largely, a current output from the MOSFET in the receiving core 37 is still responsive to a potential difference between RX3 and RX4.

Meanwhile, a current amplifier in a subsequent stage of the receiving core 36 is a circuit that flows a constant current based on a GND potential, so that this current amplifier does not operate in the period +dV/dt.

By obtaining a voltage signal by conversion from the aforementioned current signal, even if the dV/dt noise is caused to place a signal output from the isolation transformer at a voltage going out of an operable range of the circuit configuration, a voltage signal based on a potential difference between output-side terminals of the isolation transformer can still be received.

By using the aforementioned voltage signal, even in the period +dV/dt, a potential at each of RX3 and RX4 is still reflected in OUT.

Figure 8:
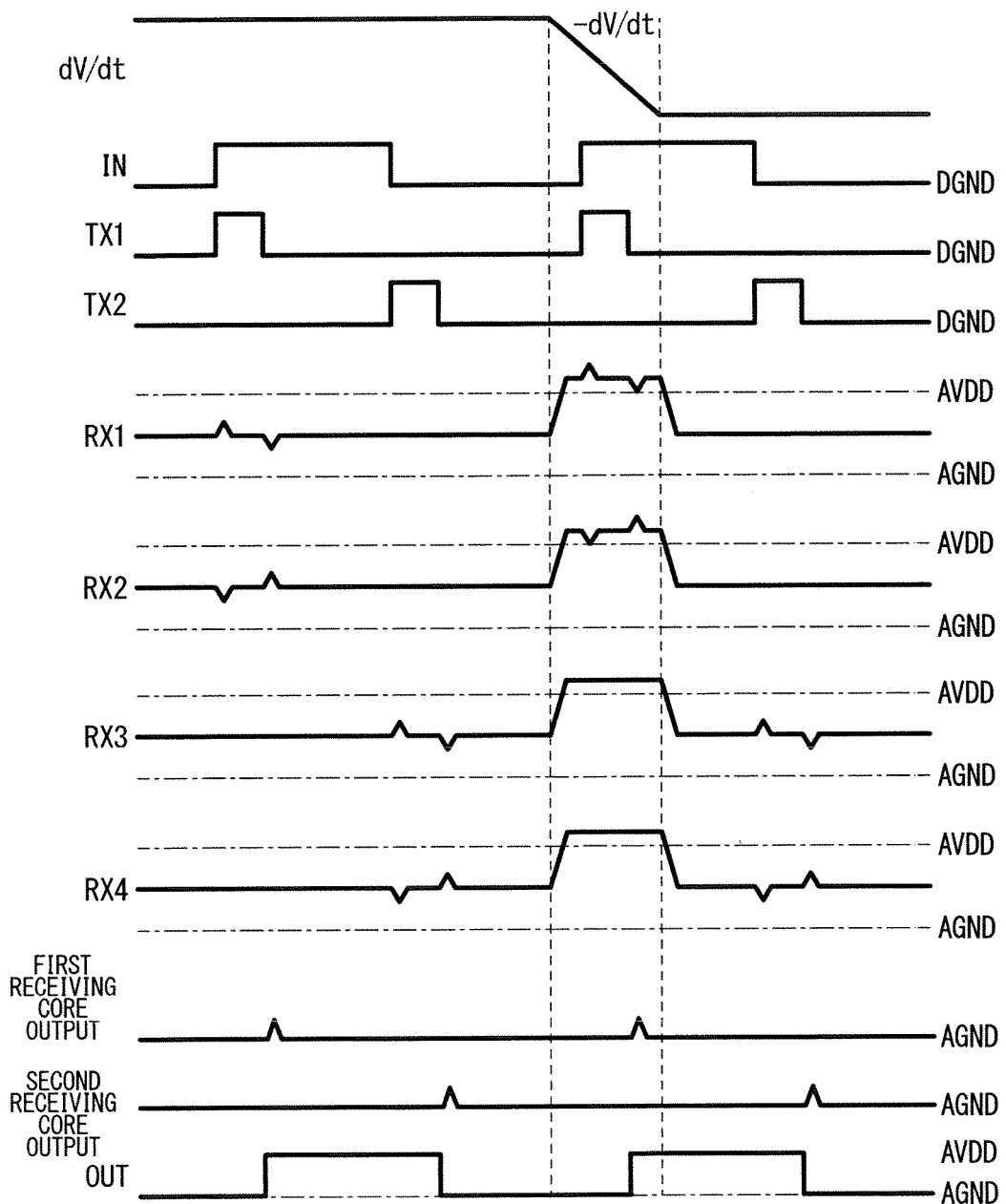
FIG. 8 is a sequence chart illustrating variations in potentials at the isolation transformer terminals during −dV/dt.

FIG. 8 is a sequence chart illustrating variations in potentials at the isolation transformer terminals in an instance where a reference potential in the output-side circuit configuration varies negatively, specifically, during −dV/dt.

FIG. 8 illustrates the following in the order named: dV/dt; a potential (IN) of an input signal shown in FIG. 4; a potential (TX1) of an output signal from the demodulation circuit 31 shown in FIG. 4; a potential (TX2) of an output signal from the demodulation circuit 33 shown in FIG. 4; a potential (RX1) of a received signal at the receiving core 34 shown in FIG. 4; a potential (RX2) of a received signal at the receiving core 35 shown in FIG. 4; a potential (RX3) of a received signal at the receiving core 36 shown in FIG. 4; a potential (RX4) of a received signal at the receiving core 37 shown in FIG. 4; a potential of an output signal from each of the receiving cores 34 and 36 (first receiving core output) shown in FIG. 4; a potential of an output signal from each of the receiving cores 35 and 37 (second receiving core output) shown in FIG. 4; and a potential (OUT) of an output signal from the SR-flip-flop latch circuit 42 shown in FIG. 4.

As illustrated in FIG. 8, in a period −dV/dt, due to the occurrence of the dV/dt noise, potential increase, more specifically, potential increase to a value near a power supply potential of the output-side circuit configuration is observed at each of RX1, RX2, RX3, and RX4. In the period −dV/dt, a potential at each of RX1 and RX2 takes a value larger than the power supply potential.

Meanwhile, the gate potential of the MOSFET 400 in the receiving core 34 is connected to RX2. Thus, even if the dV/dt noise is caused to make a potential at each of RX1 and RX2 vary largely, a current output from the MOSFET 400 in the receiving core 34 is still responsive to a potential difference between RX1 and RX2.

Likewise, the gate potential of the MOSFET 401 in the receiving core 35 is connected to RX1. Thus, even if the dV/dt noise is caused to make a potential at each of RX1 and RX2 vary largely, a current output from the MOSFET 401 in the receiving core 35 is still responsive to a potential difference between RX1 and RX2.

Meanwhile, the current amplifier 407 in a subsequent stage of the receiving core 35 is a circuit that flows the constant current 42 based on a power supply potential, so that the current amplifier 407 does not operate in the period −dV/dt.

By obtaining a voltage signal by conversion from the aforementioned current signal, even if the dV/dt noise is caused to place a signal output from the isolation transformer at a voltage going out of an operable range of the circuit configuration, a voltage signal based on a potential difference between the output-side terminals of the isolation transformer can still be received.

By using the aforementioned voltage signal, even in the period −dV/dt, a potential at each of RX1 and RX2 is still reflected in OUT.

In the circuit configuration illustrated in FIGS. 4 to 6, in both the period +dV/dt and the period −dV/dt, at least one circuit operates to achieve signal transmission.

In the circuit configuration illustrated in FIGS. 4 to 6, in both the period +dV/dt and the period −dV/dt, a signal can be transmitted from the output-side circuit to the input-side circuit, specifically, a signal can be transmitted in the reverse direction.

In the circuit configuration illustrated in FIGS. 4 to 6, a pair of receiving cores is provided in correspondence with one isolation transformer. Alternatively, a circuit configuration may also be such that one receiving core is provided in correspondence with one isolation transformer, specifically, one transistor is provided having a source potential and a gate potential connected to one isolation transformer across RX1 and RX2. Even with this circuit configuration, the signal transmission device is stilled allowed to operate under a particular situation. This will also apply to preferred embodiments described below.

Second Preferred Embodiment

A signal transmission device according to a second preferred embodiment will be described below. In the following description, structures comparable to those of the above-described preferred embodiment will be given the same signs, and where appropriate, description of such structures will be omitted.

<Configuration of Signal Transmission Device>

Figure 9:
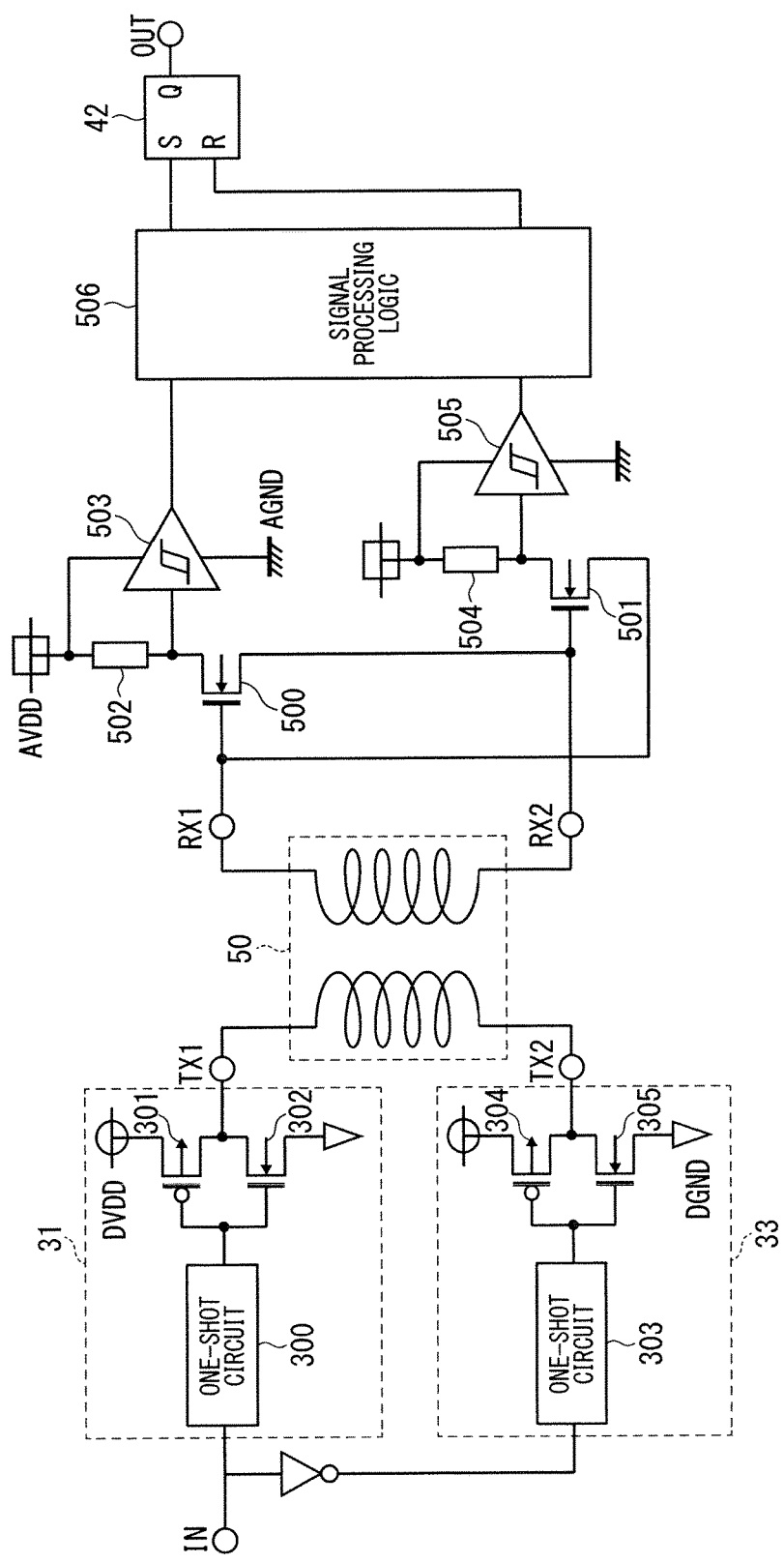
FIG. 9 schematically illustrates the configuration of a signal transmission device according to the preferred embodiment.

FIG. 9 schematically illustrates the configuration of the signal transmission device according to the second preferred embodiment. The signal transmission device illustrated in FIG. 9 has a double-ended circuit configuration using one transformer. This achieves size reduction in a circuit configuration.

The signal transmission device illustrated in FIG. 9 includes a modulation circuit 31 that operates on an ON edge. The modulation circuit 31 functions as an input-side modulation circuit connected to a terminal portion of an isolation transformer 50. The signal transmission device illustrated in FIG. 9 includes a modulation circuit 33 that operates on an OFF edge. The modulation circuit 33 functions as an input-side modulation circuit connected to a terminal portion of the isolation transformer 50.

The modulation circuits 31 and 33 are connected to the opposite terminal portions on the input side of the isolation transformer 50.

The modulation circuit 31 includes a one-shot circuit 300, a MOSFET 301, and a MOSFET 302.

The modulation circuit 33 includes a one-shot circuit 303, a MOSFET 304, and a MOSFET 305.

The signal transmission device illustrated in FIG. 9 includes an N-type MOSFET 500 and an N-type MOSFET 501. The MOSFET 500 has a gate potential connected to RX1 as an output-side isolation transformer terminal of the isolation transformer 50. The MOSFET 501 has a gate potential connected to RX2 as an output-side isolation transformer terminal of the isolation transformer 50 and on an opposite side to RX1.

The MOSFET 500 has a source potential connected to RX2 on an opposite side. Likewise, the MOSFET 501 has a source potential connected to RX1 on an opposite side.

The MOSFET 500 has a drain terminal connected to a power supply (AVDD) via a load 502. In response to a voltage signal generated at the load 502, a waveform shaping circuit 503 outputs a signal.

The MOSFET 501 has a drain terminal connected to a power supply (AVDD) via a load 504. In response to a voltage signal generated at the load 504, a waveform shaping circuit 505 outputs a signal.

The signal output from the waveform shaping circuit 503 and the signal output from the waveform shaping circuit 505 are processed by a signal processing logic 506 and a resultant output is demodulated to produce a signal at an SR-flip-flop latch circuit 42. As a result, an output signal (OUT) is generated.

In the signal transmission device illustrated in FIG. 9, a current responsive to a potential difference between RX1 and RX2 flows in the MOSFET 500. Meanwhile, the source potential of the MOSFET 500 is connected to RX2 on an opposite side to RX1 to which the gate potential of the MOSFET 500 is connected. Thus, a potential difference between the source and the gate of the MOSFET 500 is equal to a potential difference between RX1 and RX2.

Likewise, a current responsive to a potential difference between RX1 and RX2 flows in the MOSFET 501. Meanwhile, the source potential of the MOSFET 501 is connected to RX1 on an opposite side to RX2 to which the gate potential of the MOSFET 501 is connected. Thus, a potential difference between the source and the gate of the MOSFET 501 is equal to a potential difference between RX1 and RX2.

As a result, even if dV/dt noise is caused to make a potential at each of RX1 and RX2 vary largely, a current output from the MOSFET 500 or 501 is still responsive to a potential difference between RX1 and RX2.

If a potential difference is not generated between RX1 and RX2, a gate potential is not applied to either of the MOSFETs 500 and 501. Thus, the gate of each of the MOSFETs 500 and 501 is OFF.

Meanwhile, if a potential difference is generated between RX1 and RX2 to cause a current to flow from RX1 to RX2, the gate of the MOSFET 500 becomes ON. By contrast, a negative bias is applied to the gate of the MOSFET 501, so that the gate of the MOSFET 501 is OFF.

This operation also applies to an instance where the dV/dt noise is caused to make a potential at each of RX1 and RX2 vary largely.

If a potential difference is generated between RX1 and RX2 to cause a current to flow from RX2 to RX1, the gate of the MOSFET 501 becomes ON. By contrast, a negative bias is applied to the gate of the MOSFET 500, so that the gate of the MOSFET 500 is OFF.

This operation also applies to an instance where the dV/dt noise is caused to make a potential at each of RX1 and RX2 vary largely.

Even if a potential at a terminal portion of the isolation transformer 50 drops in the period +dV/dt, the aforementioned configuration makes it possible to apply a normal gate voltage to each of the MOSFETs 500 and 501. This achieves signal transmission in the period +dV/dt.

Figure 10:
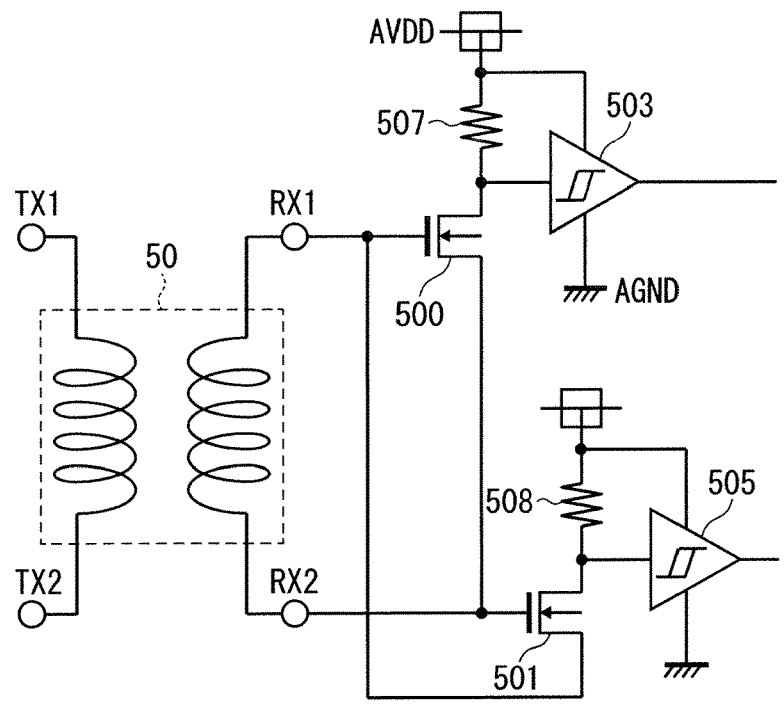

FIG. 10 schematically illustrates a part of the configuration of the signal transmission device according to the second preferred embodiment.

The signal transmission device illustrated in FIG. 10 includes the N-type MOSFET 500 and the N-type MOSFET 501. The MOSFET 500 has a gate potential connected to RX1 on the output side of the isolation transformer 50. The MOSFET 501 has a gate potential connected to RX2 on the output side of the isolation transformer 50.

The MOSFET 500 has a drain terminal connected to a power supply (AVDD) via a resistance load 507. In response to a voltage signal generated at the resistance load 507, the waveform shaping circuit 503 outputs a signal.

The MOSFET 501 has a drain terminal connected to a power supply (AVDD) via a resistance load 508. In response to a voltage signal generated at the resistance load 508, the waveform shaping circuit 505 outputs a signal.

Providing the resistance loads 507 and 508 makes it possible to reduce a circuit scale, while facilitating setting of a load.

Figure 11:
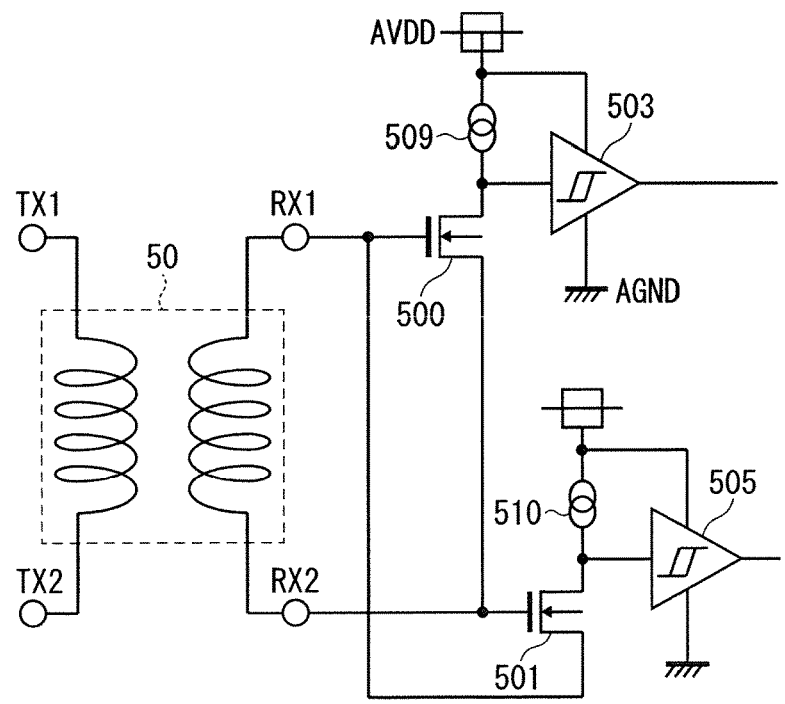

FIG. 11 schematically illustrates a part of the configuration of the signal transmission device according to the second preferred embodiment.

The signal transmission device illustrated in FIG. 11 includes the N-type MOSFET 500 and the N-type MOSFET 501. The MOSFET 500 has a gate potential connected to RX1 on the output side of the isolation transformer 50. The MOSFET 501 has a gate potential connected to RX2 on the output side of the isolation transformer 50.

The MOSFET 500 has a drain terminal connected to a power supply (AVDD) via a constant-current load 509. In response to a voltage signal generated at the constant-current load 509, the waveform shaping circuit 503 outputs a signal.

The MOSFET 501 has a drain terminal connected to a power supply (AVDD) via a constant-current load 510. In response to a voltage signal generated at the constant-current load 510, the waveform shaping circuit 505 outputs a signal.

Providing the constant-current loads 509 and 510 makes it possible to set a load independently of a power supply voltage.

FIG. 12 schematically illustrates a part of the configuration of the signal transmission device according to the second preferred embodiment.

The signal transmission device illustrated in FIG. 12 includes the N-type MOSFET 500 and the N-type MOSFET 501. The MOSFET 500 has a gate potential connected to RX1 on the output side of the isolation transformer 50. The MOSFET 501 has a gate potential connected to RX2 on the output side of the isolation transformer 50.

The MOSFET 500 has a drain terminal connected to a power supply (AVDD) via a P-type MOSFET 511. In response to a voltage signal generated at the P-type MOSFET 511, the waveform shaping circuit 503 outputs a signal.

The MOSFET 501 has a drain terminal connected to a power supply (AVDD) via a P-type MOSFET 512. In response to a voltage signal generated at the P-type MOSFET 512, the waveform shaping circuit 505 outputs a signal.

Providing the P-type MOSFET 511 and the P-type MOSFET 512 produces a Hi-Z state while the N-type MOSFETs are ON, thereby reducing a load. Further, a load can be increased while the N-type MOSFETs are OFF. In this way, inputs to the waveform shaping circuits in subsequent stages can be given at higher speed.

Third Preferred Embodiment

A signal transmission device according to a third preferred embodiment will be described below. In the following description, structures comparable to those of the above-described preferred embodiments will be given the same signs, and where appropriate, description of such structures will be omitted.

<Configuration of Signal Transmission Device>

Figure 13:
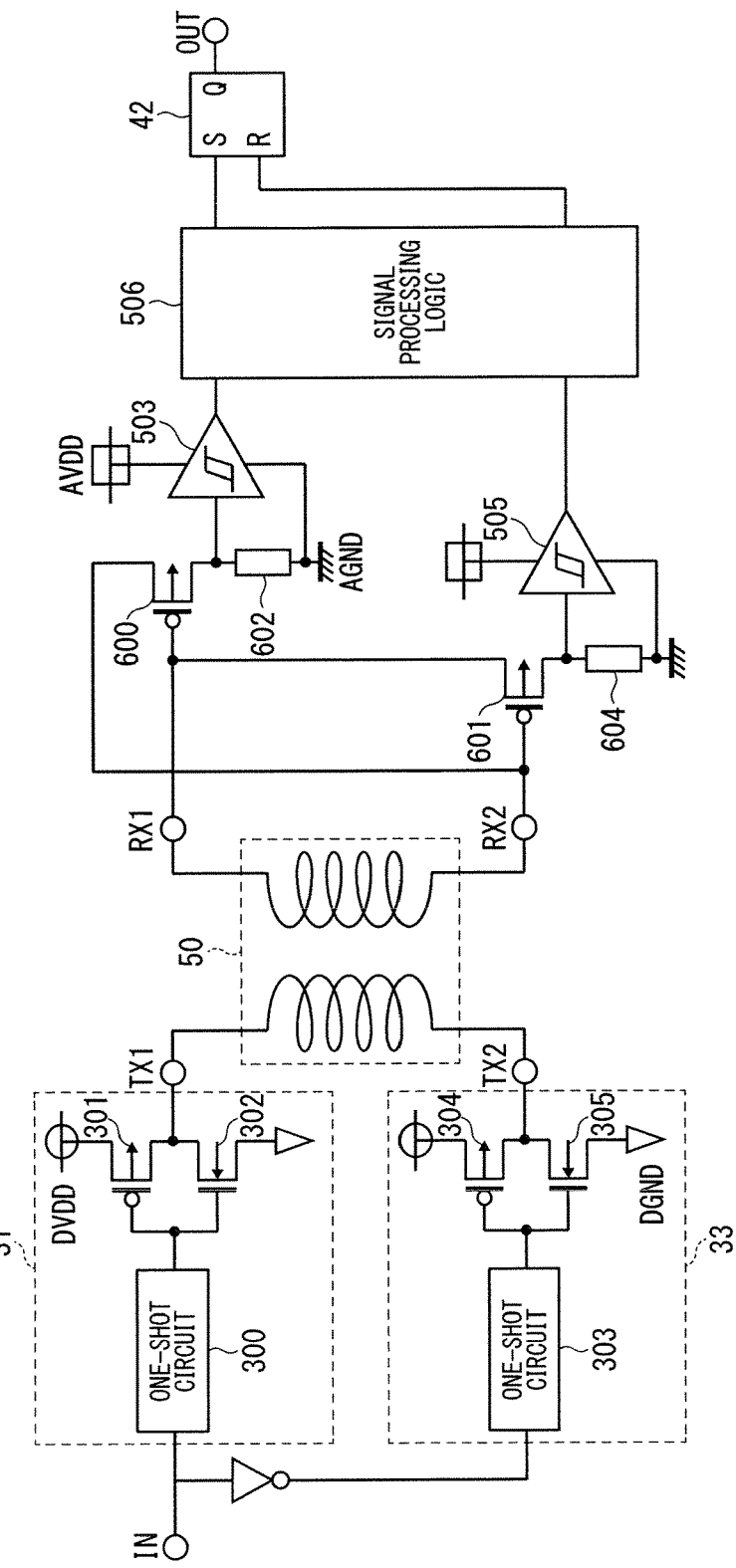
FIG. 13 schematically illustrates the configuration of a signal transmission device according to the preferred embodiment.

FIG. 13 schematically illustrates the configuration of the signal transmission device according to the third preferred embodiment. The signal transmission device illustrated in FIG. 13 has a double-ended circuit configuration using one transformer. This achieves size reduction in a circuit configuration.

The signal transmission device illustrated in FIG. 13 includes a modulation circuit 31 that operates on an ON edge. The modulation circuit 31 functions as an input-side modulation circuit connected to a terminal portion of an isolation transformer 50. The signal transmission device illustrated in FIG. 13 includes a modulation circuit 33 that operates on an OFF edge. The modulation circuit 33 functions as an input-side modulation circuit connected to a terminal portion of the isolation transformer 50.

The modulation circuits 31 and 33 are connected to the opposite terminal portions on the input side of the isolation transformer 50.

The modulation circuit 31 includes a one-shot circuit 300, a MOSFET 301, and a MOSFET 302.

The modulation circuit 33 includes a one-shot circuit 303, a MOSFET 304, and a MOSFET 305.

The signal transmission device illustrated in FIG. 13 includes a P-type MOSFET 600 and a P-type MOSFET 601. The MOSFET 600 has a gate potential connected to RX1 on the output side of the isolation transformer 50. The MOSFET 601 has a gate potential connected to RX2 on the output side of the isolation transformer 50.

The MOSFET 600 has a source potential connected to RX2 on an opposite side. Likewise, the MOSFET 601 has a source potential connected to RX1 on an opposite side.

The MOSFET 600 has a drain terminal connected to GND (AGND) via a load 602. In response to a voltage signal generated at the load 602, a waveform shaping circuit 503 outputs a signal.

The MOSFET 601 has a drain terminal connected to GND (AGND) via a load 604. In response to a voltage signal generated at the load 604, a waveform shaping circuit 505 outputs a signal.

The signal output from the waveform shaping circuit 503 and the signal output from the waveform shaping circuit 505 are processed by a signal processing logic 506 and a resultant output is demodulated to produce a signal at an SR-flip-flop latch circuit 42. As a result, an output signal (OUT) is generated.

In the signal transmission device illustrated in FIG. 13, a current responsive to a potential difference between RX1 and RX2 flows in the MOSFET 600. Meanwhile, the source potential of the MOSFET 600 is connected to RX2 on an opposite side to RX1 to which the gate potential of the MOSFET 600 is connected. Thus, a potential difference between the source and the gate of the MOSFET 600 is equal to a potential difference between RX1 and RX2.

Likewise, a current responsive to a potential difference between RX1 and RX2 flows in the MOSFET 601. Meanwhile, the source potential of the MOSFET 601 is connected to RX1 on an opposite side to RX2 to which the gate potential of the MOSFET 601 is connected. Thus, a potential difference between the source and the gate of the MOSFET 601 is equal to a potential difference between RX1 and RX2.

As a result, even if dV/dt noise is caused to make a potential at each of RX1 and RX2 vary largely, a current output from the MOSFET 600 or 601 is still responsive to a potential difference between RX1 and RX2.

Even if a potential at a terminal portion of the isolation transformer 50 is increased in the period −dV/dt, the aforementioned configuration makes it possible to apply a normal gate voltage to each of the MOSFETs 600 and 601. This achieves signal transmission in the period −dV/dt.

FIG. 14 schematically illustrates a part of the configuration of the signal transmission device according to the third preferred embodiment.

The signal transmission device illustrated in FIG. 14 includes the P-type MOSFET 600 and the P-type MOSFET 601. The MOSFET 600 has a gate potential connected to RX1 on the output side of the isolation transformer 50. The MOSFET 601 has a gate potential connected to RX2 on the output side of the isolation transformer 50.

The MOSFET 600 has a drain terminal connected to GND (AGND) via a resistance load 607. In response to a voltage signal generated at the resistance load 607, the waveform shaping circuit 503 outputs a signal.

The MOSFET 601 has a drain terminal connected to GND (AGND) via a resistance load 608. In response to a voltage signal generated at the resistance load 608, the waveform shaping circuit 505 outputs a signal.

Providing the resistance loads 607 and 608 makes it possible to reduce a circuit scale, while facilitating setting of a load.

FIG. 15 schematically illustrates a part of the configuration of the signal transmission device according to the third preferred embodiment.

The signal transmission device illustrated in FIG. 15 includes the P-type MOSFET 600 and the P-type MOSFET 601. The MOSFET 600 has a gate potential connected to RX1 on the output side of the isolation transformer 50. The MOSFET 601 has a gate potential connected to RX2 on the output side of the isolation transformer 50.

The MOSFET 600 has a drain terminal connected to GND (AGND) via a constant-current load 609. In response to a voltage signal generated at the constant-current load 609, the waveform shaping circuit 503 outputs a signal.

The MOSFET 601 has a drain terminal connected to GND (AGND) via a constant-current load 610. In response to a voltage signal generated at the constant-current load 610, the waveform shaping circuit 505 outputs a signal.

Providing the constant-current loads 609 and 610 makes it possible to set a load independently of a power supply voltage.

Figure 16:
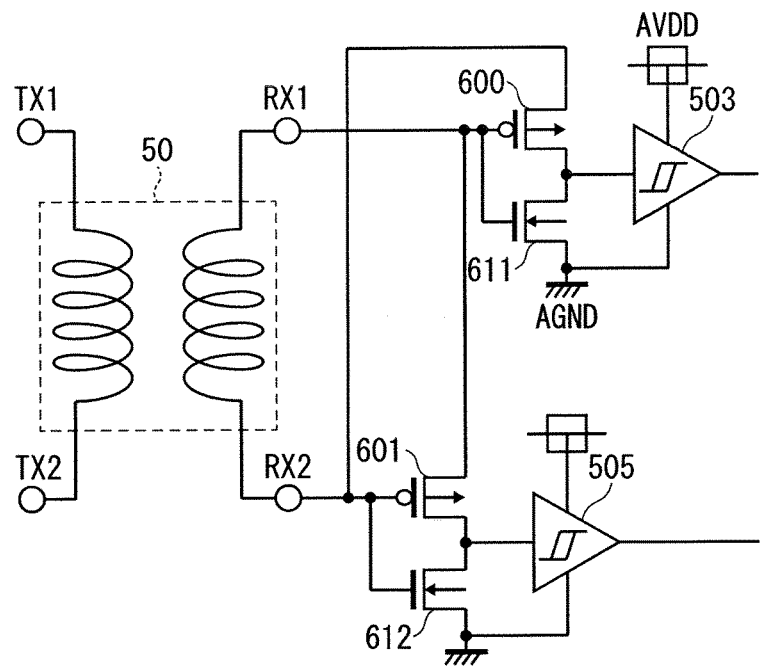

FIG. 16 schematically illustrates a part of the configuration of the signal transmission device according to the third preferred embodiment.

The signal transmission device illustrated in FIG. 16 includes the P-type MOSFET 600 and the P-type MOSFET 601. The MOSFET 600 has a gate potential connected to RX1 on the output side of the isolation transformer 50. The MOSFET 601 has a gate potential connected to RX2 on the output side of the isolation transformer 50.

The MOSFET 600 has a drain terminal connected to GND (AGND) via an N-type MOSFET 611. In response to a voltage signal generated at the N-type MOSFET 611, the waveform shaping circuit 503 outputs a signal.

The MOSFET 601 has a drain terminal connected to GND (AGND) via an N-type MOSFET 612. In response to a voltage signal generated at the N-type MOSFET 612, the waveform shaping circuit 505 outputs a signal.

Providing the N-type MOSFET 611 and the N-type MOSFET 612 produces a Hi-Z state while the P-type MOSFETs are ON, thereby reducing a load. Further, a load can be increased while the P-type MOSFETs are OFF. In this way, inputs to the waveform shaping circuits in subsequent stages can be given at higher speed.

Fourth Preferred Embodiment

A signal transmission device and a power switching element driving device according to a fourth preferred embodiment will be described below. In the following description, structures comparable to those of the above-described preferred embodiments will be given the same signs, and where appropriate, description of such structures will be omitted.

Figure 17:
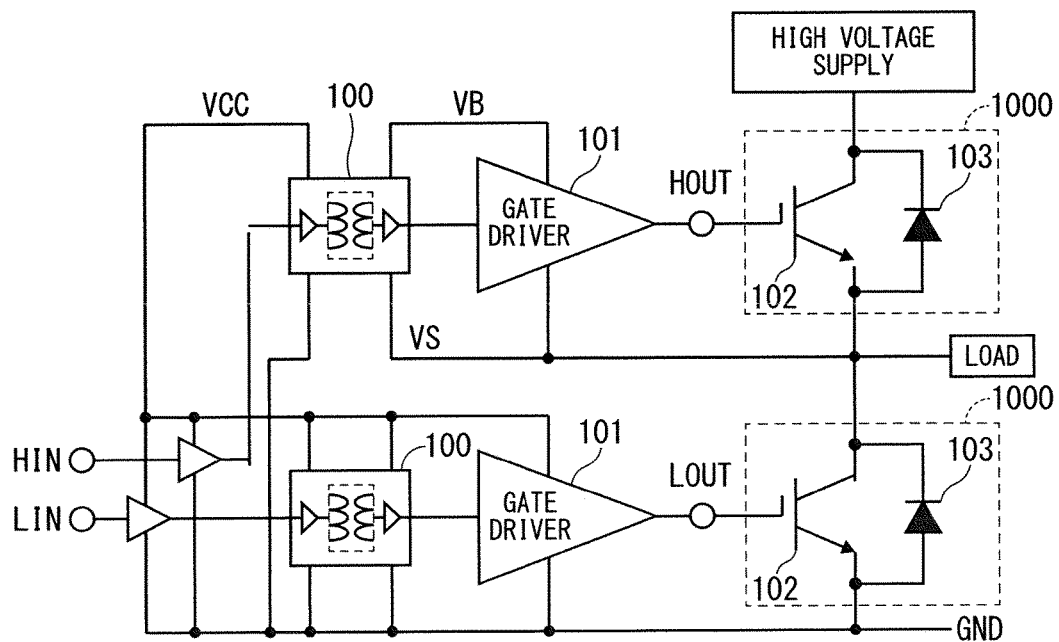

FIG. 17 illustrates a circuit configuration to which a signal transmission device 100 according to the above-described preferred embodiments is applied.

As illustrated in FIG. 17, a gate driver 101 is connected to the signal transmission device 100. The gate driver 101 has an output terminal to which a power switching element 1000 is connected.

More specifically, the power switching element 1000 includes an insulated gate bipolar transistor, specifically, an IGBT 102, and a free-wheeling diode, specifically, an FWD 103.

The IGBT 102 has a gate potential connected to the output terminal of the gate driver 101. The FWD 103 is connected to the IGBT 102 across the collector potential and the emitter potential of the IGBT 102.

This circuit configuration is usable for high-speed communication required for signal transmission in a P-side element driver circuit section to make signal communication between different power supplies, or required for application to real time control (RTC).

Such high-speed communication is assumed to cause high-speed and large potential variations in an output-side circuit configuration. Hence, the occurrence of dV/dt noise is considered to result in output of a voltage signal going out of an operable range of the output-side circuit configuration. The aforementioned circuit configuration is particularly useful in such an instance.

This circuit configuration is usable as information communication means employing A/D conversion instead of using a pulse width modulation (specifically, a PWM) signal.

Fifth Preferred Embodiment

A signal transmission device and a power switching element driving device according to a fifth preferred embodiment will be described below. In the following description, structures comparable to those of the above-described preferred embodiments will be given the same signs, and where appropriate, description of such structures will be omitted.

FIG. 18 illustrates a circuit configuration to which the signal transmission device 100 according to the above-described preferred embodiments is applied.

As illustrated in FIG. 18, a gate driver 101 is connected to the signal transmission device 100. The gate driver 101 has an output terminal to which a power switching element 1001 is connected.

More specifically, the power switching element 1001 includes an SiC-metal-oxide-semiconductor field-effect transistor (specifically, an SiC-MOSFET) 104, and a Schottky barrier diode (specifically, an SBD) 105.

The SiC-MOSFET 104 has a gate potential connected to the output terminal of the gate driver 101. The SBD 105 is connected to the SiC-MOSFET 104 across the drain potential and the source potential of the SiC-MOSFET 104.

This circuit configuration is usable for high-speed communication required for signal transmission in a P-side element driver circuit section to make signal communication between different power supplies, or required for application to RTC. Further, this circuit configuration is usable as information communication means employing A/D conversion instead of using a PWM signal.

<Effects Achieved by Above-Described Preferred Embodiments>

Effects achieved by the above-described preferred embodiments will be described next. The effects described below are achieved by the specific structures illustrated in the above-described preferred embodiments. However, as long as comparable effects are to be achieved, these particular structures can be replaced by different particular structures illustrated in the specification of the present application.

This replacement can be made across two or more of the preferred embodiments. Specifically, structures illustrated different preferred embodiments can be combined, as long as such a combination achieves a comparable effect.

According to the above-described preferred embodiments, the signal transmission device includes the isolation transformer 30, the input-side circuit connected to the input side of the isolation transformer 30, and the output-side circuit connected to the output side of the isolation transformer 30. The output-side circuit is connected to a first terminal (RX1) and a second terminal (RX2). The first terminal is on the output side of the isolation transformer 30. The second terminal is on the output side of the isolation transformer 30 and on an opposite side to RX1. The output-side circuit includes a first differential circuit. The first differential circuit corresponds to at least one of the receiving cores 34 and 35, and at least one of the receiving cores 36 and 37, for example. The receiving core 34 has a first input and a second input connected to RX1 and RX2 respectively. The receiving core 34 outputs a signal responsive to a potential difference between the first input and the second input. A reference potential of the receiving core 34 is connected to RX2.

According to the aforementioned configuration, even if the dV/dt noise is caused to place a signal at a voltage going out of an operable range of the circuit, the signal can still be transmitted. More specifically, as a result of the connection of a reference potential of the receiving core 34 to RX2, even if the dV/dt noise is caused to make a potential at each of RX1 and RX2 vary largely, a current responsive to a potential difference between RX1 and RX2 still flows in the receiving core 34. Thus, even if a signal is placed at a voltage going out of an operable range of the circuit in a period when the dV/dt noise is caused, this signal can still be received as a signal at a voltage falling within the operable range of the circuit.

The structures other than the aforementioned structures illustrated in the specification of the present application can be omitted, where appropriate. Specifically, the aforementioned structures can alone achieve the above-described effects.

However, the above-described effects can also be achieved by adding at least one of the other structures illustrated in the specification of the present application to the aforementioned structures appropriately, specifically, by adding the structures except for the aforementioned structures and illustrated in the specification of the present application to the aforementioned structures.

According to the above-described preferred embodiments, the receiving core 34 is a transistor having a reference potential connected to RX2. With this configuration, the gate potential of the MOSFET 400 is connected to RX2. Thus, even if the dV/dt noise is caused to make a potential at each of RX1 and RX2 vary largely, a current responsive to a potential difference between RX1 and RX2 still flows in the MOSFET 400. Thus, even if a signal is placed at a voltage going out of an operable range of the circuit in a period when the dV/dt noise is caused, this signal can still be received as a signal at a voltage falling within the operable range of the circuit.

According to the above-described preferred embodiments, the first differential circuit is the N-type MOSFET 501 having a source potential connected to RX1 and a gate potential connected to RX2. The output-side circuit includes the load 504 connected between a power supply potential and the drain potential of the MOSFET 501. With this configuration, an operable range of the N-type MOSFET is not limited with respect to +dV/dt. Further, a signal can be transmitted in the period +dV/dt.

According to the above-described preferred embodiments, a load is the resistance load 508. This configuration facilitates setting of a load. This configuration can also reduce a circuit scale.

According to the above-described preferred embodiments, a load is the constant-current load 510. This configuration achieves setting of a load independently of variations in a power supply.

According to the above-described preferred embodiments, a load is the P-type MOSFET 512. This configuration produces a high-impedance (Hi-Z) state while the N-type MOSFET is ON, while producing a low-impedance (Lo-Z) state while the N-type MOSFET is OFF. This increases the operating speed of the signal transmission device.

According to the above-described preferred embodiments, the first differential circuit is the P-type MOSFET 601 having a source potential connected to RX1 and a gate potential connected to RX2. The output-side circuit includes the load 604 connected between a GND potential and the drain potential of the MOSFET 601. With this configuration, an operable range of the P-type MOSFET is not limited with respect to −dV/dt. Further, a signal can be transmitted in the period −dV/dt.

According to the above-described preferred embodiments, a load is the resistance load 608. This configuration facilitates setting of a load. This configuration can also reduce a circuit scale.

According to the above-described preferred embodiments, a load is the constant-current load 610. This configuration achieves setting of a load independently of variations in a power supply.

According to the above-described preferred embodiments, a load is the N-type MOSFET 612. This configuration produces a Hi-Z state while the P-type MOSFET is ON, while producing a Lo-Z state while the P-type MOSFET is OFF. This increases the operating speed of the signal transmission device.

According to the above-described preferred embodiments, the output-side circuit includes a first signal conversion circuit. The first signal conversion circuit corresponds to at least one of the signal conversion circuits 38 and 39, and at least one of the signal conversion circuits 40 and 41, for example. The signal conversion circuit 38 is connected to the receiving core 34 and converts an output signal from the receiving core 34 to a voltage signal based on a GND potential. The signal conversion circuit 39 is connected to the receiving core 35 and converts an output signal from the receiving core 35 to a voltage signal based on a power supply potential. With this configuration, a current signal output from the receiving core can be converted to a voltage signal. Even if a potential at each of RX1 and RX2 increases in the period −dV/dt, converting an output signal to a voltage signal based on a GND potential still makes it possible to transmit a voltage signal responsive to a potential difference between RX1 and RX2. Further, even if a potential at each of RX1 and RX2 drops in the period +dV/dt, converting an output signal to a voltage signal based on a power supply potential still makes it possible to transmit a voltage signal responsive to a potential difference between RX1 and RX2.

According to the above-described preferred embodiments, the signal conversion circuit 38 includes an amplifier circuit and a voltage conversion circuit. The amplifier circuit corresponds to the current amplifier 404, for example. The voltage conversion circuit corresponds to the current-to-voltage conversion circuit 405, for example. The current amplifier 404 amplifies an output signal from the receiving core 34. The current-to-voltage conversion circuit 405 converts the amplified output signal from the receiving core 34 to a voltage signal. With this configuration, if an output signal from the receiving core 34 is smaller than a predetermined value, this output signal can be amplified and the resultant amplified signal can be converted to a voltage signal.

According to the above-described preferred embodiments, the current amplifier 404 includes the current mirror circuit. A current can be amplified by such a simple configuration.

According to the above-described preferred embodiments, the current-to-voltage conversion circuit 405 includes a current mirror latch circuit. A current can be converted to a voltage by such a simple configuration.

According to the above-described preferred embodiments, the output-side circuit includes a second differential circuit. If the first differential circuit is the receiving core 34, the second differential circuit corresponds to the receiving core 35, for example. If the first differential circuit is the receiving core 35, the second differential circuit corresponds to the receiving core 34, for example. If the first differential circuit is the receiving core 36, the second differential circuit corresponds to the receiving core 37, for example. If the first differential circuit is the receiving core 37, the second differential circuit corresponds to the receiving core 36, for example. The receiving core 35 has a third input and a fourth input connected to RX2 and RX1 respectively. The receiving core 35 outputs a signal responsive to a potential difference between the third input and the fourth input. A reference potential of the receiving core 35 is connected to RX1. With this configuration, both the differential circuit achieving signal transmission in the period +dV/dt and the differential circuit achieving signal transmission in the period −dV/dt can be provided at the same time. In the double-ended circuit configuration illustrated in FIG. 9 using one transformer, for example, both the differential circuit corresponding to a current flow direction from RX1 to RX2 and the differential circuit corresponding to a current flow direction from RX2 to RX1 can be provided at the same time. With this configuration, while a signal is to be transmitted from the output-side circuit to the input-side circuit with respect to the isolation transformer, both the differential circuit achieving signal transmission in the period +dV/dt and the differential circuit achieving signal transmission in the period −dV/dt can be provided at the same time.

According to the above-described preferred embodiments, the receiving core 35 is a transistor having a reference potential connected to RX1. With this configuration, the gate potential of the MOSFET 401 is connected to RX1. Thus, even if the dV/dt noise is caused to make a potential at each of RX1 and RX2 vary largely, a current responsive to a potential difference between RX1 and RX2 still flows in the MOSFET 401. Thus, even if a signal is placed at a voltage going out of an operable range of the circuit in a period when the dV/dt noise is caused, this signal can still be received as a signal at a voltage falling within the operable range of the circuit.

According to the above-described preferred embodiments, the output-side circuit includes a second signal conversion circuit. If the first signal conversion circuit is the signal conversion circuit 38, the second signal conversion circuit corresponds to the signal conversion circuit 39, for example. If the first signal conversion circuit is the signal conversion circuit 39, the second signal conversion circuit corresponds to the signal conversion circuit 38, for example. If the first signal conversion circuit is the signal conversion circuit 40, the second signal conversion circuit corresponds to the signal conversion circuit 41, for example. If the first signal conversion circuit is the signal conversion circuit 41, the second signal conversion circuit corresponds to the signal conversion circuit 40, for example. The signal conversion circuit 38 is connected to the receiving core 34 and converts an output signal from the receiving core 34 to a voltage signal based on a GND potential. The signal conversion circuit 39 is connected to the receiving core 35 and converts an output signal from the receiving core 35 to a voltage signal based on a power supply potential. With this configuration, a current signal output from the receiving core 35 can be converted to a voltage signal. Even if a potential at each of RX1 and RX2 increases in the period −dV/dt, converting an output signal to a voltage signal based on a GND potential still makes it possible to transmit a voltage signal responsive to a potential difference between RX1 and RX2. Further, even if a potential at each of RX1 and RX2 drops in the period +dV/dt, converting an output signal to a voltage signal based on a power supply potential still makes it possible to transmit a voltage signal responsive to a potential difference between RX1 and RX2.

According to the above-described preferred embodiments, if the signal conversion circuits 38 and 39 are circuits that generate voltage signals by conversion based on different potentials, the output-side circuit includes the synthesis circuit 43 and an output circuit. The output circuit corresponds to the SR-flip-flop latch circuit 42, for example. The synthesis circuit 43 synthesizes an output signal from the receiving core 34 and an output signal from the receiving core 35 by OR logic. The SR-flip-flop latch circuit 42 processes an output from the synthesis circuit 43 and outputs a result as a set signal or a reset signal. With this configuration, in each of the periods +dV/dt and −dV/dt, a set signal or a reset signal can be output by transmitting a signal via the isolation transformer.

According to the above-described preferred embodiments, the power switching element driving device includes the signal transmission device 100, the gate driver 101 connected to the signal transmission device 100, and the power switching element 1000 connected to the output terminal of the gate driver 101. With this configuration, even if the dV/dt noise is caused while a semiconductor switching element operates, a signal can still be transmitted. This configuration can eliminate the need for watchdog in the output-side circuit or need for continuous pulse transmission from the input-side circuit. In this way, a circuit scale can be reduced.

According to the above-described preferred embodiments, the power switching element 1000 includes the insulated gate bipolar transistor 102 having a gate potential connected to the output terminal of the gate driver 101, and the free-wheeling diode 103 connected to the insulated gate bipolar transistor 102 across the collector potential and the emitter potential of the insulated gate bipolar transistor 102. With this configuration, even if the dV/dt noise is caused while the semiconductor switching element having an inverter configuration using the IGBT and the FWD operates, a signal can still be transmitted.

According to the above-described preferred embodiments, the power switching element 1001 includes the SiC-MOSFET 104 having a gate potential connected to the output terminal of the gate driver 101, and the Schottky barrier diode 105 connected to the SiC-MOSFET 104 across the drain potential and the source potential of the SiC-MOSFET 104. With this configuration, even if the dV/dt noise is caused while the semiconductor switching element having an inverter configuration using the MOSFET and the SBD operates, a signal can still be transmitted.

According to the above-described preferred embodiments, the power switching element 1001 is formed by using an SiC material. With this configuration, high-speed and high-temperature operation can be achieved by utilizing the characteristics of SiC.

Modifications of Above-Described Preferred Embodiments

In the above-described preferred embodiments, each component may be described in terms of a viewpoint such as properties, material, dimension, shape, arrangement relative to a different component, or a condition for implementation, etc. However, these viewpoints described in the specification of the present application are in all aspects illustrative and not restrictive.

Thus, numerous modifications and equivalents not illustrated are assumed to be included within the technical scope disclosed in the specification of the present application. These modifications and equivalents include modification, addition, or omission of at least one component, and extraction of at least one component from at least one of the preferred embodiments and combination of the extracted component with a component in a different preferred embodiment, for example.

As long as no contradiction is to occur, a component described in a "singular form" in the preferred embodiments may include "one or more" such components.

Each component in the above-described preferred embodiments is a conceptual unit. The technical scope disclosed in the specification of the present application includes an instance where one component is formed of a plurality of structures, an instance where one component corresponds to a part of some structure, and an instance where a plurality of components is provided in one structure.

Each component in the above-described preferred embodiments includes a structure having a different configuration or a different shape, as long as such a component fulfills the same function.

The description given in the specification of the present application should in all aspects be referred to for all purposes relating to the technique disclosed in the specification of the present application and should never be recognized as a background art.

Where the name of a material is given without any particular designation in the above-described preferred embodiments, for example, as long as no contradiction is to occur, this material covers a material with an additive such as an alloy.

Each component in the above-described preferred embodiments is assumed to function both as software or firmware, and as corresponding hardware. Each component falling in both of these concepts is called a "unit" or a "processing circuit," for example.

The technique disclosed in the specification of the present application can also be implemented if each component in the above-described preferred embodiments is provided in a distributed manner in a plurality of devices. Specifically, the technique disclosed in the specification of the present application can be implemented in a form such as a system.

While the invention has been shown and described in detail, the foregoing description is in all aspects illustrative and not restrictive. It is therefore understood that numerous modifications and variations can be devised without departing from the scope of the invention.

What is claimed is:

1. A signal transmission device comprising:
an isolation transformer;
an input-side circuit connected to an input side of said isolation transformer; and
an output-side circuit connected to an output side of said isolation transformer, wherein said output-side circuit is connected to a first terminal and a second terminal, said first terminal being on the output side of said isolation transformer, said second terminal being on the output side of said isolation transformer and on an opposite side to said first terminal,
said output-side circuit includes a first differential circuit having a first input and a second input connected to said first terminal and said second terminal, respectively, said first differential circuit outputs a signal responsive to a potential difference between said first input and said second input, and a reference potential of said first differential circuit is connected to said second terminal, said output-side circuit further includes:

a second differential circuit having a third input and a fourth input connected to said second terminal and said first terminal, respectively;

a first signal conversion circuit connected to said first differential circuit; and a second signal conversion circuit connected to said second differential circuit, said second signal conversion circuit converting an output signal from said second differential circuit to a voltage signal based on a GND potential or a voltage signal based on a power supply potential, and said first signal conversion circuit and said second signal conversion circuit generate voltage signals by conversion based on different potentials, said first signal conversion circuit being connected to said first differential circuit and converting an output signal from said first differential circuit to a voltage signal based on the GND potential or a voltage signal based on the power supply potential, and said output-side circuit further includes:

a synthesis circuit that synthesizes said output signal from said first differential circuit and said output signal from said second differential circuit by OR logic; and an output circuit that processes an output from said synthesis circuit and outputs a result as a set signal or a reset signal.

2. The signal transmission device according to claim 1, wherein said first differential circuit is a transistor having a reference potential connected to said second terminal.

3. The signal transmission device according to claim 2, wherein
said first differential circuit is an N-type MOSFET having a source potential connected to said first terminal and a gate potential connected to said second terminal, and
said output-side circuit further includes a load connected between a power supply potential and a drain potential of said first differential circuit.

4. The signal transmission device according to claim 3, wherein
said load is a resistance.

5. The signal transmission device according to claim 3, wherein
said load is a constant-current load.

6. The signal transmission device according to claim 3, wherein
said load is a P-type MOSFET.

7. The signal transmission device according to claim 2, wherein
said first differential circuit is a P-type MOSFET having a source potential connected to said first terminal and a gate potential connected to said second terminal, and
said output-side circuit further includes a load connected between a GND potential and a drain potential of said first differential circuit.

8. The signal transmission device according to claim 7, wherein
said load is a resistance.

9. The signal transmission device according to claim 7, wherein
said load is a constant-current load.

10. The signal transmission device according to claim 7, wherein
said load is an N-type MOSFET.

11. The signal transmission device according to claim 1, wherein
said first signal conversion circuit includes:
an amplifier circuit that amplifies said output signal from said first differential circuit; and a voltage conversion circuit that converts the amplified output signal from said first differential circuit to a voltage signal.

12. The signal transmission device according to claim 11, wherein
said amplifier circuit includes a current mirror circuit.

13. The signal transmission device according to claim 11, wherein
said voltage conversion circuit includes a current mirror latch circuit.

14. The signal transmission device according to claim 1, wherein
said second differential circuit outputs a signal responsive to a potential difference between said third input and said fourth input, and a reference potential of said second differential circuit is connected to said first terminal.

15. The signal transmission device according to claim 14, wherein
said second differential circuit is a transistor having a reference potential connected to said first terminal.

16. A power switching element driving device comprising:
the signal transmission device as recited in claim 1;
a gate driver connected to said signal transmission device; and
a power switching element connected to an output terminal of said gate driver.

17. The power switching element driving device according to claim 16, wherein
said power switching element includes:
an insulated gate bipolar transistor having a gate potential connected to said output terminal of said gate driver; and
a free-wheeling diode connected to said insulated gate bipolar transistor across a collector potential and an emitter potential of said insulated gate bipolar transistor.

18. The power switching element driving device according to claim 16, wherein
said power switching element includes:
a MOSFET having a gate potential connected to said output terminal of said gate driver; and
a Schottky barrier diode connected to said MOSFET across a drain potential and a source potential of said MOSFET.

19. The power switching element driving device according to claim 18, wherein
said power switching element is formed by using an SiC material.

20. The signal transmission device according to claim 1, wherein
said reference potential of said first differential circuit is directly connected to said second terminal.

* * * * *